United States Patent
Tatsumi

(10) Patent No.: US 6,870,589 B2
(45) Date of Patent: Mar. 22, 2005

(54) LIQUID CRYSTAL DISPLAY ELEMENT

(75) Inventor: Hironobu Tatsumi, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 157 days.

(21) Appl. No.: 10/032,878

(22) Filed: Oct. 24, 2001

(65) Prior Publication Data

US 2002/0067456 A1 Jun. 6, 2002

(30) Foreign Application Priority Data

Oct. 26, 2000 (JP) .......................................... 2000-327716

(51) Int. Cl.$^7$ ............................................. G02F 1/1345
(52) U.S. Cl. ..................... 349/149; 349/138; 349/154; 349/152; 349/139; 349/150; 349/151; 349/137; 349/148
(58) Field of Search ..................... 349/143, 73, 158, 349/122, 202, 144, 145

(56) References Cited

U.S. PATENT DOCUMENTS

| | | | | |
|---|---|---|---|---|
| 5,745,202 A | * | 4/1998 | Yamauchi et al. | 349/110 |
| 5,969,780 A | * | 10/1999 | Matsumoto et al. | 349/106 |
| 6,198,051 B1 | * | 3/2001 | Moshrefzadeh et al. | 172/255 |
| 6,198,521 B1 | * | 3/2001 | Oh-ide | 349/149 |
| 6,369,867 B1 | * | 4/2002 | Ge | 349/72 |
| 6,573,954 B1 | * | 6/2003 | Hirose et al. | 349/43 |

FOREIGN PATENT DOCUMENTS

| | | | | |
|---|---|---|---|---|
| JP | 05-341298 | | 12/1993 | ......... G02F/1/1343 |
| JP | 10-142597 | | 5/1998 | ......... G02F/1/1335 |
| JP | 10260420 | * | 9/1998 | ......... G02F/1/1345 |

* cited by examiner

Primary Examiner—Nathan J. Flynn
Assistant Examiner—Fazli Erdem
(74) Attorney, Agent, or Firm—David G. Conlin; Richard J. Roos; Edwards & Angell, LLP

(57) ABSTRACT

A liquid crystal display element includes two substrates, each made of a plastic plate, which are combined with each other; a terminal section which is provided so as to be extended from one of the substrates; and a plurality of connecting electrodes, provided on the terminal section, that connects pixels to a liquid crystal display section, wherein each of connecting electrodes has a plurality of slots that prevent penetration of cracks which occur substantially parallel in a width direction of the connecting electrode.

31 Claims, 30 Drawing Sheets

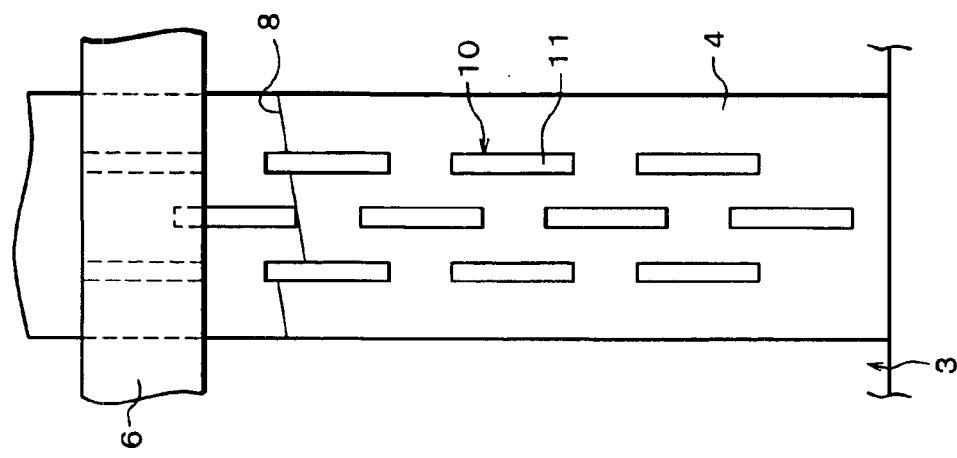
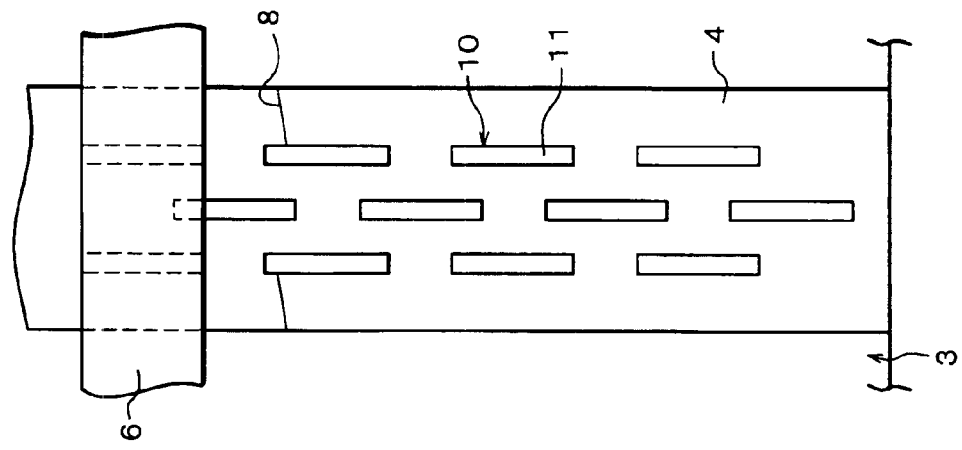

F I G. 1 5 (a)    F I G. 1 5 (b)
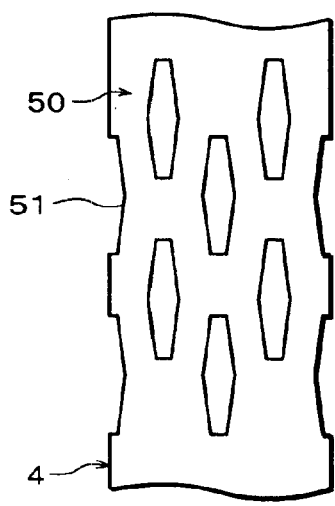 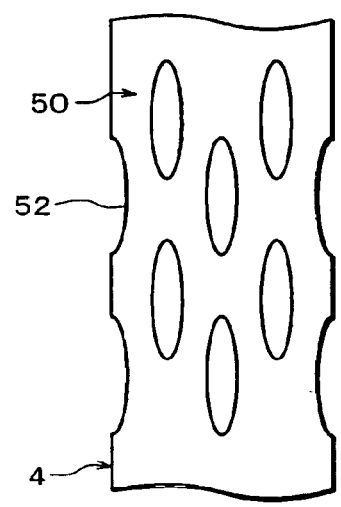

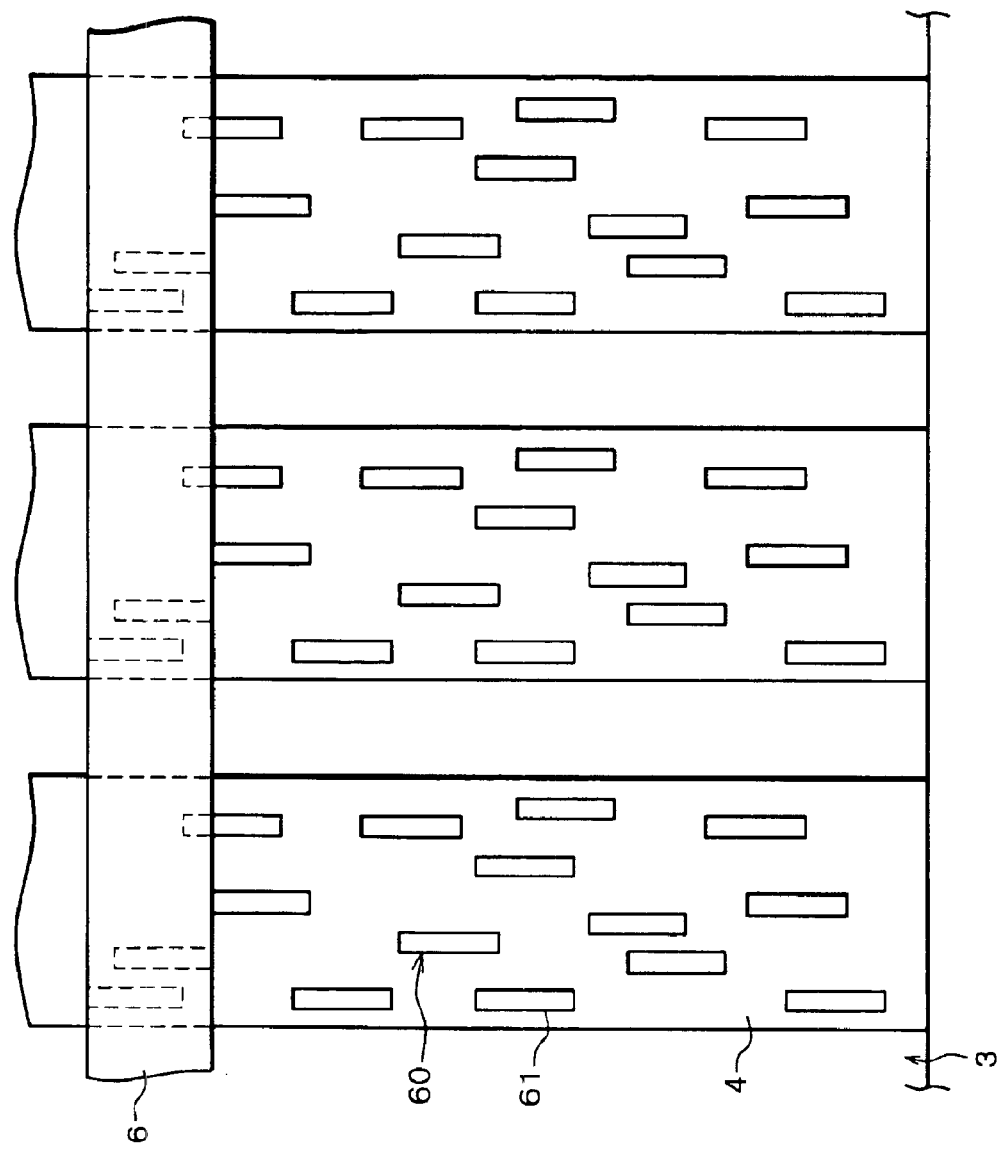

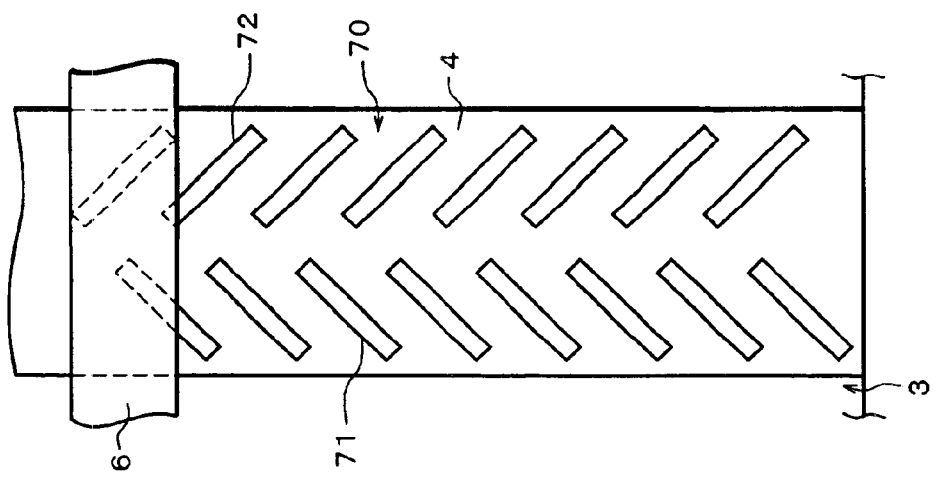
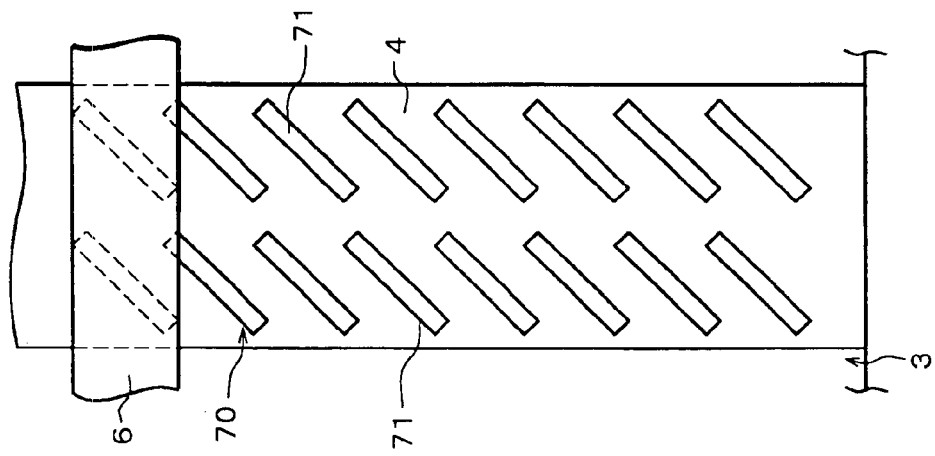

$A+B+C+D+E=L$
$B+D=s$

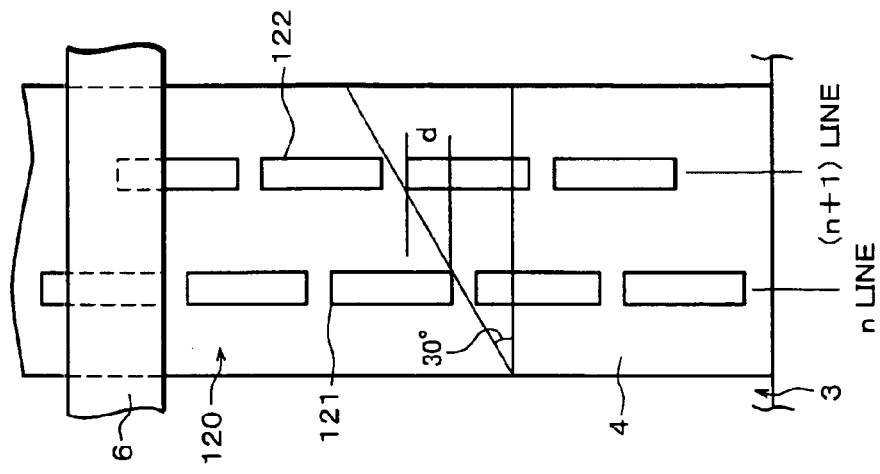
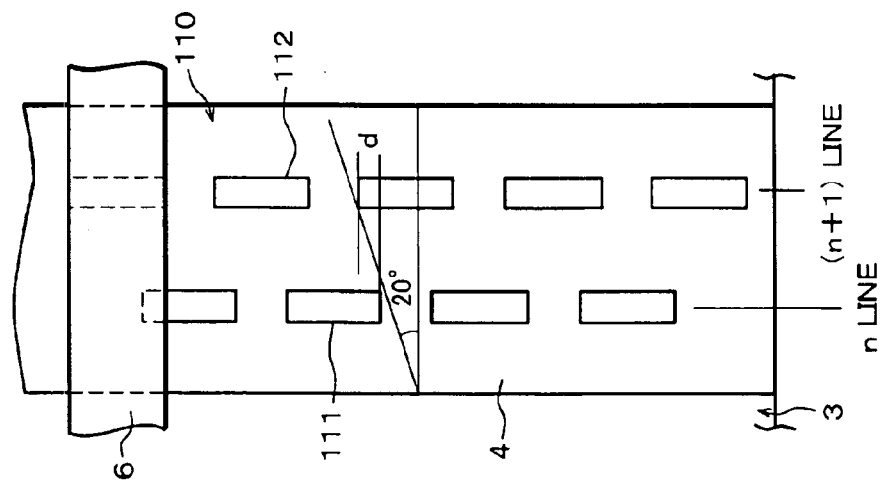

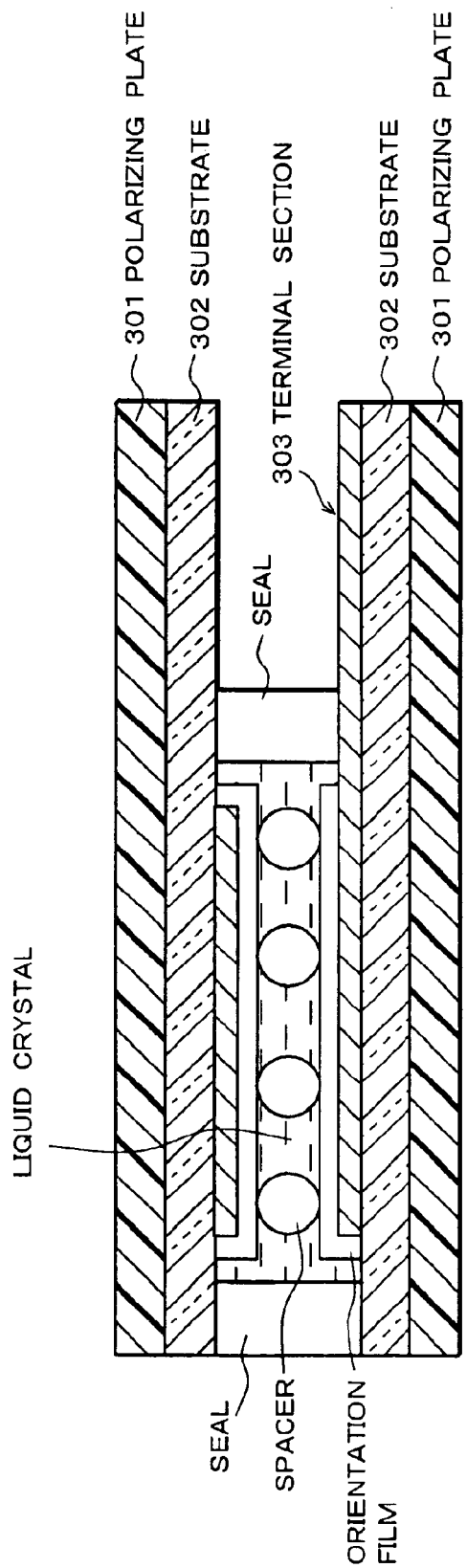

LIQUID CRYSTAL DISPLAY ELEMENT

FIELD OF THE INVENTION

The present invention relates to a liquid crystal display element using plastic substrates, and specifically to a structure of a connecting electrode of a terminal section of the liquid crystal display element.

BACKGROUND OF THE INVENTION

A liquid crystal display element, as shown in FIG. 26(a) and FIG. 26(b), includes substrates 201 and 202 which are combined with each other; a terminal section 203, provided so as to be extended from the substrate 202, that is connected to a liquid crystal driving circuit.

Connecting electrodes 204 provided on the terminal section 203 are made of the same material as a liquid crystal driving transparent electrode, and as shown in FIG. 27(a) and FIG. 27(b), are arranged on the terminal section 203 in parallel slit and in lines. These connecting electrodes 204 are provided between the substrates 201 and 202, and a sealing section 206 is provided around the substrate 201.

Here, when a flexible polymeric film or seat is used for the substrates 201 and 202 making up a liquid crystal display element, the connecting electrode 204 made of a transparent conductor represented by an ITO (Indium Tin Oxide) are too hard to match the flexibility of the substrates 201 and 202. Thus, as shown in FIG. 28, the terminal section 203 is bent, so that, as shown in FIG. 29 and FIG. 30, cracks 211 and 212 occur in the connecting electrodes 204. As a result, a liquid crystal driving circuit and pixel electrodes etc. of a liquid crystal which are provided on a driving substrate 205 (see FIG. 26(b)) are separated from each other electrically (hereinbelow referred to as disconnection).

An external force exerted on the terminal section of the liquid crystal display element bends the terminal section when a person performs a resin cutting process etc. or transports the liquid crystal display panel. Thus, the disconnection occurs. Particularly, in transporting the liquid crystal display panel, a packing material comes to contact with the terminal section 203, so that the terminal section 203 is bent about θ=20°, as shown in FIG. 28.

While, for example, Japanese Unexamined Patent Publication No. 142597/1998 (Tokukaihei 10-142597) (publication date: May 29, 1998) discloses a method for decreasing the flexibility so as to prevent the disconnection of the liquid crystal display panel in pressing the terminal section 203 on the driving substrate 205.

According to the Publication, for example, as shown in FIG. 31, it is disclosed to employ a process by which polarizing plates 301 and 301 are extended so that the extended portion is placed above the terminal section 303 which exists between the substrates 302 and 302.

However, in the conventional liquid crystal display element, it is possible to prevent the disconnection of the liquid crystal display panel by decreasing the flexibility of the terminal section 303, but this makes it difficult to connect the liquid crystal driving circuit, and this allows a portion in which the terminal section 303 exists to be thick, because the driving substrate provided with the liquid crystal driving circuit, and the substrates 302 and 302, and the polarizing plates 301 and 301 are overlapped.

SUMMARY OF THE INVENTION

The object of the present invention is to provide a liquid crystal display element which can prevent disconnection of connecting electrodes brought about by the bend of a substrate which occurs in some cases including transport of the liquid crystal display element, without making connection of a liquid crystal driving circuit difficult, and without increasing thickness of a terminal section.

The liquid crystal display element of the present invention, in order to achieve the foregoing object, includes two substrates, each made of a plastic plate, which are combined with each other; a terminal section which is provided so as to be extended from one of the substrates; and a plurality of connecting electrodes, provided on the terminal section, that connects pixels to a liquid crystal driving circuit, wherein each of the connecting electrodes has a hole section that prevents penetration of a crack which occurs substantially parallel to a width direction of the connecting electrode.

According to the invention, the liquid crystal display element includes two substrates, each made of a plastic plate, which are combined with each other; a terminal section which is provided so as to be extended from one of the substrates; and a plurality of connecting electrodes, provided on the terminal section, that connects pixels to a liquid crystal driving circuit.

Here, in the liquid crystal display element, a crack occurs in the connecting electrode due to the bend of the substrate brought about in some cases including transport of the liquid crystal display element. The crack occurs in a linear manner with s slope of 0° to 20° with respect to the width direction of the connecting electrode, and the crack penetrates the connecting electrode in the width direction, so that there is a case where the disconnection of the connecting electrode occurs.

However, according to the present invention, the hole section is provided so as to prevent the penetration of the crack which occurs substantially parallel to a width direction of the connecting electrode.

Thus, even when the crack occurs from the side end of the connecting electrode substantially parallel with respect to a width direction, the crack is prevented from penetrating by the holes.

Further, unlike a conventional crack penetration preventing means, this crack penetration preventing means is not arranged so as to be extended from a polarizing plate, so that a portion in which the terminal section exists is not made thick, and the liquid crystal driving circuit is not prevented from being connected.

Thus, it is possible to provide the liquid crystal display element which can prevent the disconnection of the connecting electrode which occurs due to the bend of the substrate brought about in some cases including transport of the liquid crystal display element, without making connection of the liquid crystal driving circuit difficult, and without increasing the thickness of the terminal section.

Note that, Japanese Unexamined Patent Publication No. 341298/1993 (Tokukaihei 5-341298) (publication date: Dec. 24, 1993) discloses a liquid crystal display in which a mesh-like liquid crystal driving circuit is formed, but its object is to improve transmittance of a liquid crystal holder and to prevent consumption of indium which makes up an ITO by forming the mesh-like liquid crystal driving circuit. Unlike the present invention, a structure of the terminal section is not mentioned in this Publication. Thus, the foregoing publication has no relation with the present invention.

Further, the liquid crystal display element of the present invention, in order to achieve the foregoing object, includes two substrates, each made of a plastic plate, which are combined with each other; a terminal section which is provided so as to be extended from one of the substrates; and a plurality of connecting electrodes, provided on the terminal section, that connects pixels to a liquid crystal driving circuit, wherein each of the connecting electrodes has a hole section in which at least one hole is provided on respective straight lines which are parallel to each other in a width direction of the connecting electrode.

According to the invention, at least one hole is provided on respective straight lines which are parallel to each other in the width direction of the connecting electrode.

That is, in the liquid crystal display element, the crack occurs in the connecting electrode due to the bend of the substrate brought about in some cases including transport of the liquid crystal display element. The crack occurs in a linear manner with a slope of 0° to about 20° with respect to the width direction of the connecting electrodes, and penetrates the connecting electrodes in the width direction, so that there is a case where the disconnection of the connecting electrodes occurs.

Thus, like the present invention, the hole section is provided on a crossing point of the crack which occurs in a linear manner with a slope of 0° to about 20° with respect to the width direction of the connecting electrode, so that it is possible to prevent the crack from penetrating the connecting electrode in a width direction.

Particularly, in the present invention, at least one hole is provided on respective straight lines which are parallel to each other in the width direction of the connecting electrode, so that when the crack occurs in a linear manner with a slope of 0° to about 20° with respect to the width direction of the connecting electrode, the crack is prevented from penetrating by the hole.

Further, unlike a conventional crack penetration preventing means, this crack penetration preventing means is not arranged so as to be extended from a polarizing plate, so that a portion in which the terminal section exists is not made thick, and the liquid crystal driving circuit is not prevented from being connected.

Thus, it is possible to provide the liquid crystal display element which can prevent the disconnection of the connecting electrode which occurs due to the bend of the substrate brought about in some cases including transport of the liquid crystal display element, without making connection of the liquid crystal driving circuit difficult, and without increasing the thickness of the terminal section.

Further, in order to achieve the foregoing object, in the liquid crystal display element of the present invention, the hole section has a plurality of holes, and the holes are arranged in the width direction and in a length direction orthogonal to the width direction of the connecting electrode.

According to the invention, the hole section has the plurality of holes, and the holes are arranged in the width direction and in the length direction orthogonal to the width direction of the connecting electrode, so that even when the crack occurs partially, there is high possibility that a portion which is connected electrically as the connecting electrode remains somewhere in the connecting electrode.

Thus, it is possible to provide the liquid crystal display element which can unfailingly prevent the disconnection of the connecting electrode which occurs due to the bend of the substrate brought about in some cases including transport of the liquid crystal display element.

Further, in order to achieve the foregoing object, in the liquid crystal display element of the present invention, the holes are provided from an end of the connecting electrode to a sealing section of the liquid crystal display section.

That is, when the holes are provided in a range from the end of the connecting electrode to a point beyond the sealing section, the display quality of the liquid crystal display section degrades. Further, when the holes are provided from the end of the connecting electrode to a point before the sealing section, it is not possible to prevent the penetration of the crack which occurs by the sealing section.

Then, like the present invention, by providing the holes from the end of the connecting electrode to the sealing section of the liquid crystal display section, it is possible to provide the liquid crystal display element which can unfailingly prevent the disconnection of the connecting electrode which occurs due to the bend of the substrate brought about in some cases including transport of the liquid crystal display element, without degrading the display quality.

Further, in order to achieve the foregoing object, in the liquid crystal display element of the present invention, the holes are formed in the same shape.

According to the invention, since the holes are formed in the same shape, it is easy to provide the plurality of holes on the connecting electrode.

Further, in order to achieve the foregoing object, in the liquid crystal display element of the present invention, the holes are formed in different shapes.

That is, as long as the holes have a crack preventing function, they are not necessarily formed in the same shape.

Thus, in the present invention, it is possible to provide the liquid crystal display element which can prevent the disconnection of the connecting electrode which occurs due to the bend of the substrate brought about in some cases including transport of the liquid crystal display element, in the case where the holes are formed in different shapes.

Further, in order to achieve the foregoing object, in the liquid crystal display element of the present invention, the holes are formed in the notched shape on ends in the width direction of the connecting electrode.

According to the invention, the holes are formed in the notched shape also on ends in the width direction of the connecting electrode.

That is, when plural holes are provided crosswise on the connecting electrode, there is a case where the holes are mechanically provided in the notched shape on the ends of the connecting electrode partially.

However, as long as the holes have the crack preventing function, it is possible to provide the liquid crystal display element which can prevent the disconnection of the connecting electrode which occurs due to the bend of the substrate brought about in some cases including transport of the liquid crystal display element, even when the holes are formed in this manner.

Further, in order to achieve the foregoing object, in the liquid crystal display element of the present invention, the hole is a slot, and the slots are provided so that a length direction of the slots is diagonal with respect to a length direction of the connecting electrode.

According to the invention, the slots are provided so that the length direction of the slots is diagonal with respect to the length direction of the connecting electrode. Note that, the slots may be arranged so that directions of their slopes are the same, and the slots in adjacent lines may be arranged so that directions of their slopes are different.

Also in this case, as long as the slots have the crack preventing function, it is possible to provide the liquid crystal display element which can prevent the disconnection of the connecting electrode which occurs due to the bend of the substrate brought about in some cases including transport of the liquid crystal display element.

Further, in order to achieve the foregoing object, in the liquid crystal display element of the present invention, the ratio of the total width of the at least one hole provided on respective straight lines which are parallel to each other in the width direction of the connecting electrode, to the width of the connecting electrode is more than 0 and not more than 1/10.

According to the invention, since the ratio of the total width of the at least one hole provided on respective straight lines which are parallel to each other in the width direction of the connecting electrode, to the width of the connecting electrode is more than 0 and not more than 1/10, it is possible to provide the liquid crystal display element which can prevent the disconnection of the connecting electrode which occurs due to the bend of the substrate brought about in some cases including transport of the liquid crystal display element, without raising a threshold voltage in the connecting electrode largely.

Further, in order to achieve the foregoing object, in the liquid crystal display element of the present invention, the holes adjacent in the width direction of the connecting electrode are provided on a straight line whose slope is not less than 30° and not more than 90° with respect to the width direction of the connecting electrode.

That is, the crack, which occurs due to the bend of the substrate brought about in some cases including transport of the liquid crystal display element, occurs in a linear manner with a slope of 0° to 20° with respect to the width direction of the connecting electrode.

Thus, like the present invention, the holes adjacent in the width direction of the connecting electrode are provided on a straight line whose slope is not less than 30° and not more than 90° with respect to the width direction of the connecting electrode, so that any one of the holes can prevent the penetration of the crack without fail, even when the crack occurs in a linear manner with a slope of 0° to 20° with respect to the width direction of the connecting electrode.

As a result, it is possible to provide the liquid crystal display element which can prevent the disconnection of the connecting electrode which occurs due to the bend of the substrate brought about in some cases including transport of the liquid crystal display element.

Note that, it is possible to obtain the same effect, also by providing the holes in the length direction of the connecting electrode so that a straight line passing through the nearest apices of the holes in adjacent lines has a slope of not less than 30° and not more than 90° with respect to the width direction of the connecting electrode.

Further, the liquid crystal display element of the present invention, in order to achieve the foregoing object, includes two substrates, each made of a plastic plate, which are combined with each other; a terminal section which is provided so as to be extended from one of the substrates; and a plurality of connecting electrodes, provided on the terminal section, that connects pixels to a liquid crystal driving circuit, wherein each of the connecting electrodes has a plurality of holes.

According to the invention, in a case where the crack which occurs in the connecting electrode reaches the hole, the crack is prevented from extending any more, so that the disconnection of the connecting electrode is prevented.

Thus, it is possible to reduce the possibility that the disconnection of the connecting electrode occurs due to the bend of the substrate brought about in some cases including transport of the liquid crystal display element.

For a fuller understanding of the nature and advantages of the invention, reference should be made to the ensuing detailed description taken in conjunction with the accompanying drawings.

BRIEF DESCRIPTION OF THE DRAWINGS

FIG. 5(a) is a plan view showing cracks which occur in a case where the liquid crystal display element is bent 20°. FIG. 5(b) is a plan view showing cracks which occur in a case where the liquid crystal display element is bent 30°.

FIG. 15(a) is a plan view of an important portion showing a state in which hexagonal slots are formed in the notched shape on ends of the connecting electrode of the liquid crystal display element. FIG. 15(b) is a plan view of an important portion showing a state in which oval slots are formed in the notched shape on ends in a width direction of the connecting electrode of the liquid crystal display element.

FIG. 16 is a plan view showing a state in which the plurality of rectangular slots are placed at random on the connecting electrode of the liquid crystal display element.

FIG. 17(a) is a plan view of an important portion showing a state in which plural lines of plural rectangular slots are provided, and the slots are provided so that a length direction of the slots is diagonal with respect to a length direction of the connecting electrode. FIG. 17(b) is a plan view of an important portion showing a state in which plural lines of plural rectangular slots are provided, and the slots are provided so that the length direction of the slots is diagonal with respect to the length direction of the connecting electrode, and the slots in adjacent lines are arranged so that directions of their slopes are different.

FIG. 24(a) is a plan view of an important portion showing a state in which plural rectangular slots are provided in staggered manner so that a slope of a straight line passing through the nearest apices of the adjacent slots is not more than 20° with respect to the width direction of the connecting electrode of the liquid crystal element. FIG. 24(b) is a plan view of an important portion showing a state in which plural rectangular slots are provided in staggered manner so that a slope of a straight line passing through the nearest apices of the adjacent slots is not less than 30° with respect to the width direction of the connecting electrode of the liquid crystal element.

FIG. 31 is a cross sectional view showing a structure of another conventional liquid crystal display element.

DESCRIPTION OF THE EMBODIMENTS

One embodiment of the present invention is described as follows based on FIG. 1 to FIG. 25.

A liquid crystal display element of the present embodiment, as shown in FIG. 2(a) and FIG. 2(b), is formed by combining a substrate 1 with a substrate 2, and is arranged so that, for example, a terminal section 3, on which a TCP (Tape Carrier Package) is packaged, is made of a driving substrate 5 having a liquid crystal driving circuit.

Figure 3:
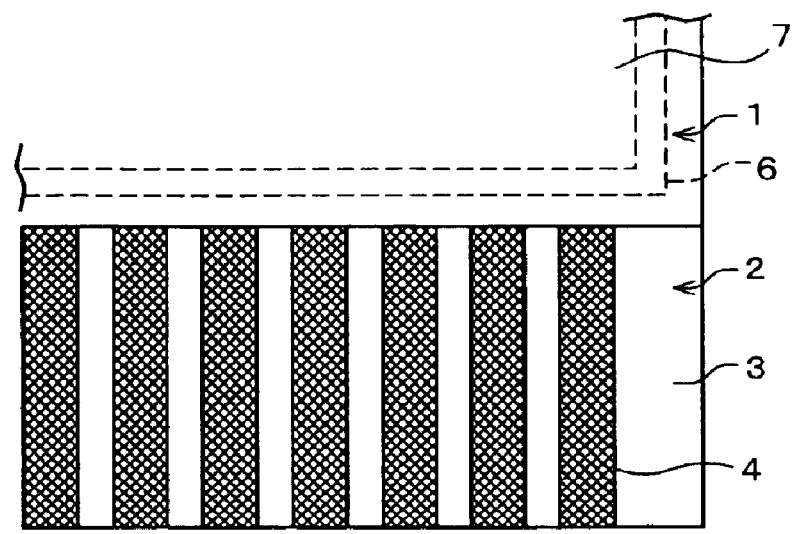
FIG. 3 is a plan view showing a structure of a terminal section of the liquid crystal display element.

Connecting electrodes 4 formed on the terminal section 3 are arranged with the same material as a liquid crystal driving transparent electrode, and as shown in FIG. 3, are placed on the terminal section 3 in parallel slit and in lines. These connecting electrodes 4 are provided between the substrates 1 and 2, and extend through an underside of a sealing section 6 provided around the substrate 1 to a liquid crystal display section 7.

In the present embodiment, a plastic made of a flexible polymeric film or seat is used to arrange the substrates 1 and 2. Further, the connecting electrodes 4 are made of a transparent conductor represented by an ITO (Indium Tin Oxide).

Figure 4:
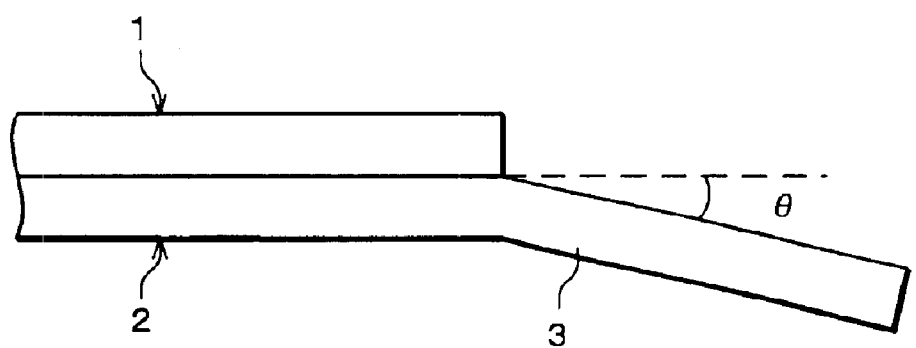
FIG. 4 is a side view showing a state in which the terminal section on a substrate of the liquid crystal display element is bent.

Incidentally, in the liquid crystal display element arranged in the foregoing manner, since the connecting electrodes 4 are harder than the substrates 1 and 2, the connecting electrodes 4 cannot match the flexibility of the substrates 1 and 2. Thus, as shown in FIG. 4, the terminal section 3 is bent, so that a crack occurs in the connecting electrodes 4. As a result, disconnection occurs between a liquid crystal driving circuit and pixel electrodes etc. of a liquid crystal.

An external force exerted on the terminal section 3 of the liquid crystal display element bends the terminal section 3 when a person performs a resin cutting process etc. or transports the liquid crystal display panel. Thus, the disconnection occurs. Particularly, in transporting the liquid crystal display panel, a packing material comes to contact with the terminal section 3, so that the terminal section 3 is bent about 20°.

Figure 1:
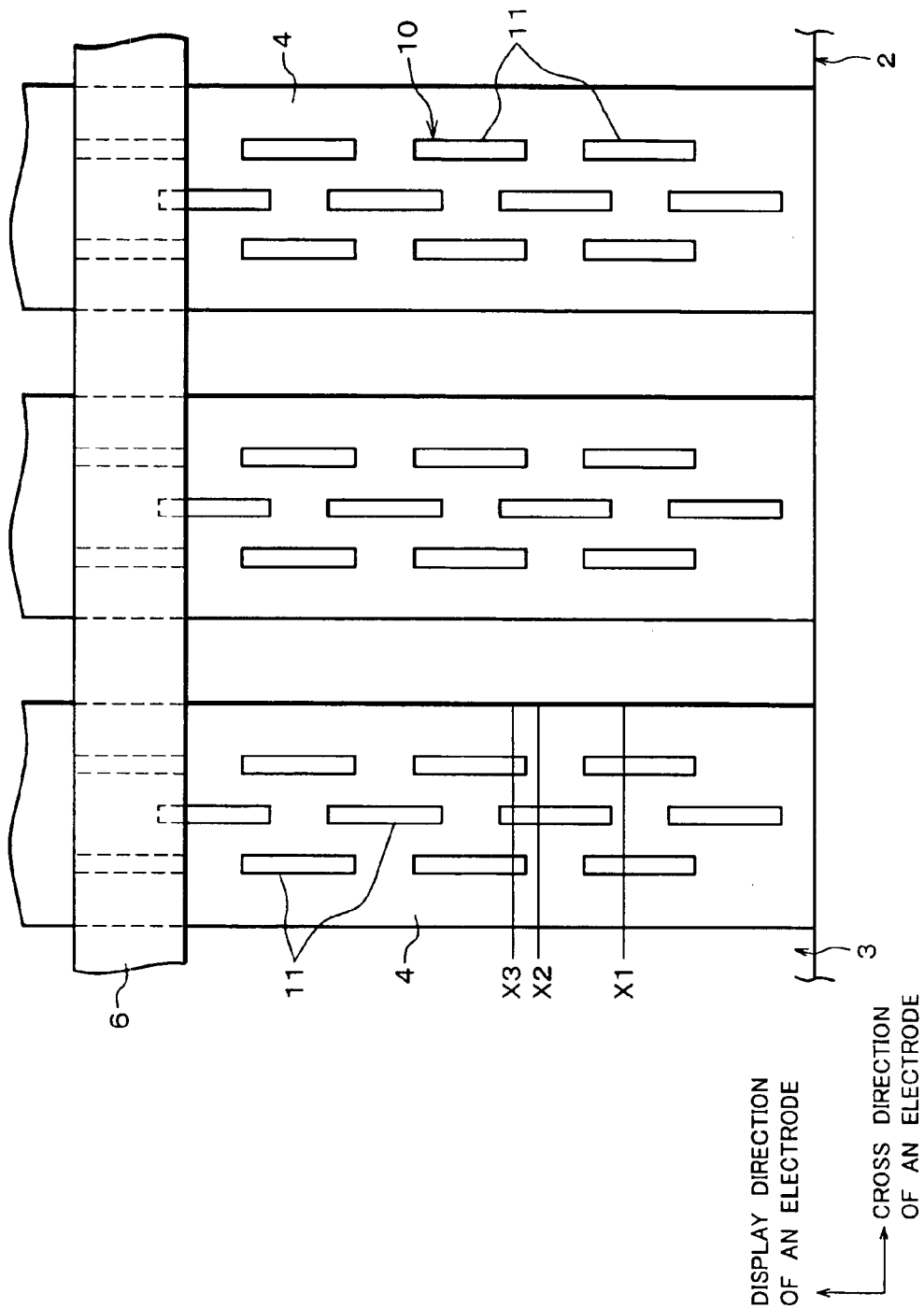
FIG. 1 shows one embodiment of a liquid crystal display element in the present invention, and is a plan view showing slots formed on connecting electrodes.
Figure 2:
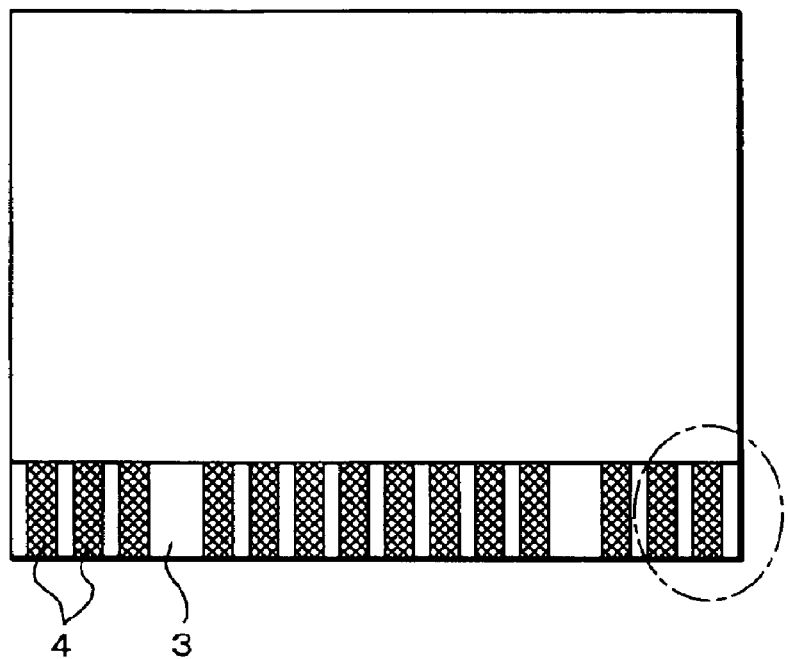
FIG. 2(a) is a plan view showing a structure of the liquid crystal display element.
FIG. 2(b) is a strabismus view of an important portion specifically showing a portion which is surrounded by an alternate long and short dash line in FIG. 2(a).
Figure 2:
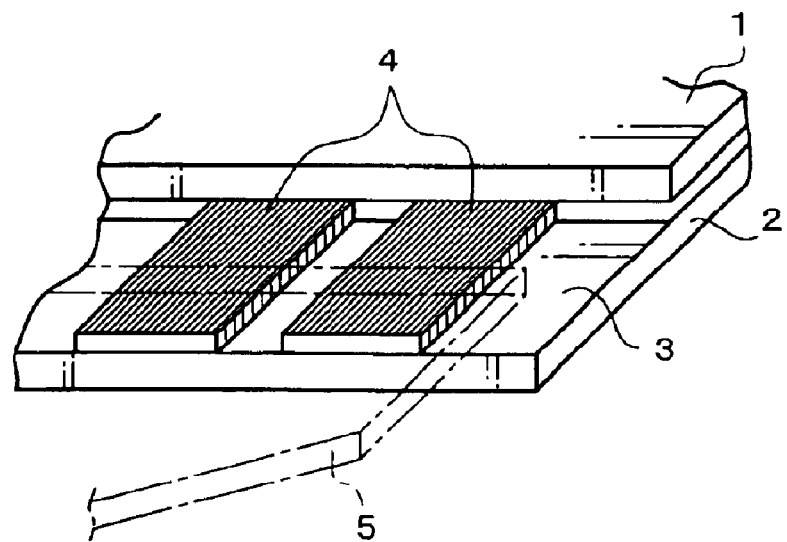

In the present embodiment, in order to solve the problem, for example, a slots group 10 having a plurality of long and narrow, rectangular slots 11 are provided on the connecting electrodes 4 by using a photo process, as shown in FIG. 1. In the connecting electrodes 4, at least one slot of the slots 11, as shown in FIG. 1, is provided on respective straight lines X1, X2, and X3 in a width direction.

In this way, at least one slot of the slots 11 is provided in a width direction of the connecting electrodes 4. Thus, even when a crack 8 occurs partially, a circuit remains connected as shown in FIG. 5(a). This reduces the disconnection.

Further, when the number of the connecting electrodes is increased, the circuit remained connected even though many cracks 8 occur. Thus, plural slots reduce the disconnection more effectively than a single slot.

Here, in the present embodiment, various examinations were given to the connecting electrodes 4 which satisfy a condition that, as shown in FIG. 1, at least one slot of the slots 11 is provided on respective straight lines X1, X2, and X3 in a width direction. In the examinations, as shown in the first to thirteenth embodiments, the shapes and layouts of the slots were examined from various view points by bending the terminal section 3 so as to measure the bending angle θ at which the disconnection occurs, and the effects were confirmed.

As a result, it was confirmed that even when the terminal section 3 was bent about 20°, it was possible to prevent the disconnection in which the liquid crystal driving circuit and the pixel electrode etc. were separated electrically from each other by the cracks 8 which occurred in the connecting electrodes 4, by providing the connecting electrodes 4 with the plurality of slots 11 to 17 (FIG. 1, and FIG. 6 to FIG. 11), slots 21 and 22 (FIG. 12), slots 31 and 32 (FIG. 13), slots 41 and 42 (FIG. 14), slots 51 and 52 (FIG. 15(a) and FIG. 15(b)), slots 61 (FIG. 16), slots 71 and 72 (FIG. 17(a) and FIG. 17(b)), slots 80 (FIG. 18(b)), slots 91 (FIG. 20), slots 101 (FIG. 23(a) and FIG. 23(b)), and slots 121 and 122 (FIG. 24(b)).

That is, in an ordinary use, it is possible to prevent the disconnection which occurs due to the bend of the terminal section 3 of a plastic liquid crystal element, by arranging the structure in which the plurality of rectangular slots 11 are provided on the connecting electrodes 4.

Further, as shown in FIG. 18(b), a plurality of rectangular slots 80 are provided from an end (lower end in FIG. 18(b)) of the terminal section 3 to the sealing section 6. This enables the liquid crystal circuit of the driving substrate 5 and the connecting electrodes 4 of the terminal section 3 to remain connected to each other, even though an external force is exerted on the whole terminal section 3, and the crack 8 occurs in a portion of the terminal section 3 in the pressing process of the terminal section 3 and a driving substrate 5 (FIG. 2(b)), or in transporting the liquid crystal display element. Thus, the disconnection is reduced.

In this way, the liquid crystal display element of the present embodiment includes the substrates 1 and 2, each made of a plate of plastic, which are combined with each other; the terminal section 3 which is provided so as to be extended from the substrate 2; and the plurality of connecting electrodes 4, provided on the terminal section 3, that connect pixels to the liquid crystal driving circuit of the driving substrate 5.

Here, in the liquid crystal display element, the cracks 8 occur in the connecting electrodes 4 due to the bend of the substrates 1 and 2 which is brought about in some cases including transport of the liquid crystal display element. The cracks 8 occur in a linear manner with a slope of 0° to about 20° with respect to a width direction of the connecting electrodes 4, and penetrate the connecting electrodes 4 in the width direction, so that the disconnection of the connecting electrodes 4 occurs.

However, in the present embodiment, the connecting electrodes 4 are provided with slots 11 to 17 (FIG. 1, and FIG. 6 to FIG. 11), slots 21 and 22 (FIG. 12), slots 31 and 32 (FIG. 13), slots 41 and 42 (FIG. 14), slots 51 and 52 (FIG. 15(a) and FIG. 15(b)), slots 61 (FIG. 16), slots 71 and 72 (FIG. 17(a) and FIG. 17(b)), slots 80 (FIG. 18(b)), slots 91 (FIG. 20), slots 101 (FIG. 23(a) and FIG. 23(b)), and slots 121 and 122 (FIG. 24(b)) so as to prevent the penetration of the cracks 8 which are formed substantially parallel with respect to the width direction of the connecting electrodes 4.

Thus, even though the cracks 8 occur from the side of the connecting electrodes 4, substantially parallel with respect to the width direction of the connecting electrodes 4, the cracks 8 are prevented from penetrating by the slots 11.

Further, such crack penetration preventing means is not arranged by extending a polarizing plate, unlike conventional crack preventing means, so that a portion in which the terminal section 3 exists is not made thick, and the liquid crystal driving circuit is not prevented from connecting.

Thus, it is possible to provide the liquid crystal display element which can prevent the disconnection of the connecting electrodes 4 which occurs due to the bend of the substrate 2 brought about in some cases including transport of the liquid crystal display element, without making connection of the liquid crystal driving circuit difficult, and without increasing the thickness of the portion in which the terminal section 3 exists.

Further, in the liquid crystal display element of the present embodiment, at least one of the slots 11 are provided on respective straight lines which are parallel to each other in the width direction of the connecting electrodes 4.

That is, the slots 11 are provided on a crossing points of the cracks 8 which occur in a linear manner with a slope of 0° to about 20° with respect to the width direction of the connecting electrodes 4, so that it is possible to prevent the cracks 8 from penetrating the connecting electrodes 4 in the width direction. Note that, "a slope of 0°" means "parallel to the width direction of the connecting electrodes 4".

Here, in the present embodiment, at least one of the slots 11 are provided on every straight line which is parallel in the width direction of the connecting electrodes 4, so that when the cracks 8 occur in a linear manner with a slope of 0° to about 20° with respect to the width direction of the connecting electrodes 4, the cracks 8 are prevented from penetrating by at least one of the slots 11.

Further, such crack penetration preventing means is not arranged by extending the polarizing plate, unlike the conventional crack preventing means, so that a portion in which the terminal section 3 exists is not made thick, and the liquid crystal driving circuit is not prevented from connecting.

Thus, it is possible to provide the liquid crystal display element which can prevent the disconnection of the connecting electrodes 4 which occurs due to the bend of the substrate 2 brought about in some cases including transport of the liquid crystal display element, without making connection of the liquid crystal driving circuit difficult, and without increasing thickness of the portion in which the terminal section 3 exists.

Note that, although, for example, the slots 11 arranged in three lines are described in the present embodiment, it is not necessary to arrange the slots in this manner, and it is possible to arrange the slots in more lines, or in a single line at the center.

Further, in the liquid crystal display element, the slot 11 is arranged in plural, and the slots 11 are arranged in the width direction and in a length direction orthogonal to the width direction of the connecting electrode 4.

Thus, even when the cracks 8 occur partially, there is high possibility that some portions connected as the connecting electrodes 4 remain.

Thus, it is possible to provide the liquid crystal display element which can unfailingly prevent the disconnection of the connecting electrodes 4 which occurs due to the bend of the substrate 2 brought about in some cases including transport of the liquid crystal display element.

Figure 18:
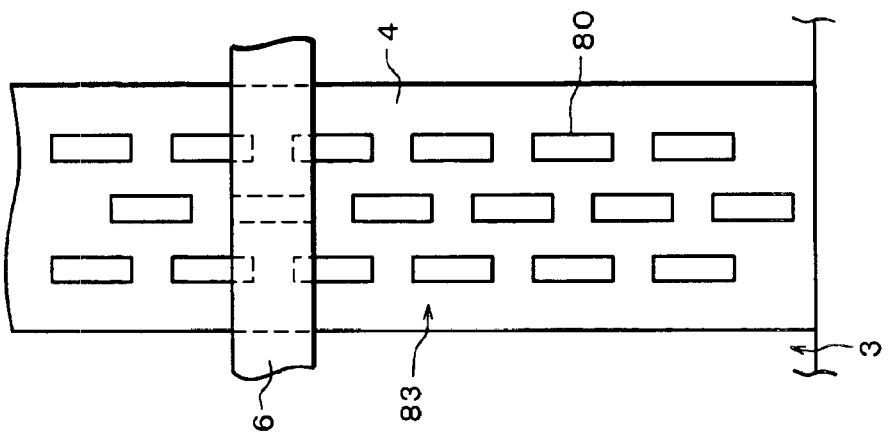
FIG. 18(a) is a plan view of an important portion showing a state in which the plurality of rectangular slots are provided from an end to a point before a sealing section of the connecting electrode of the liquid crystal display element.
FIG. 18(b) is a plan view of an important portion showing a state in which the plurality of rectangular slots are provided from an end to a sealing section of the connecting electrode of the liquid crystal display element.
FIG. 18(c) is a plan view of an important portion showing a state in which the plurality of rectangular slots are provided from an end to a point beyond a sealing section of the connecting electrode of the liquid crystal display element.
Figure 18:
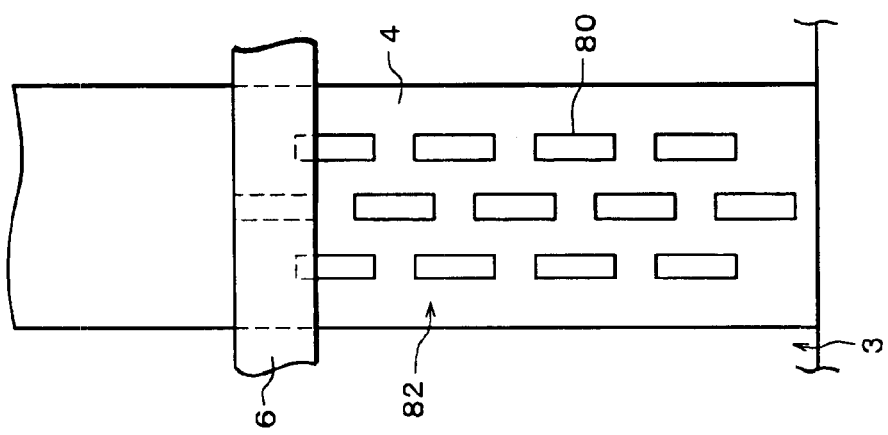
Figure 18:
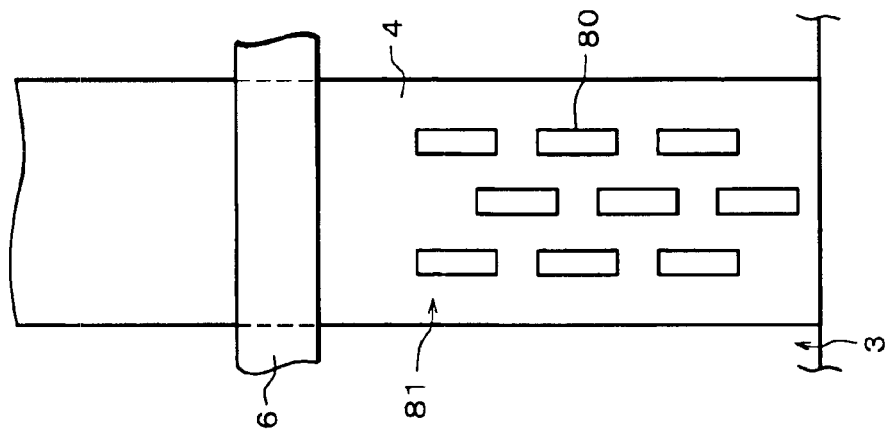

Further, in the present embodiment, the slots 80 (FIG. 18(*b*)) etc. are formed from an end of the connecting electrodes 4 to the sealing section 6 of the liquid crystal display section 7.

Figure 19:
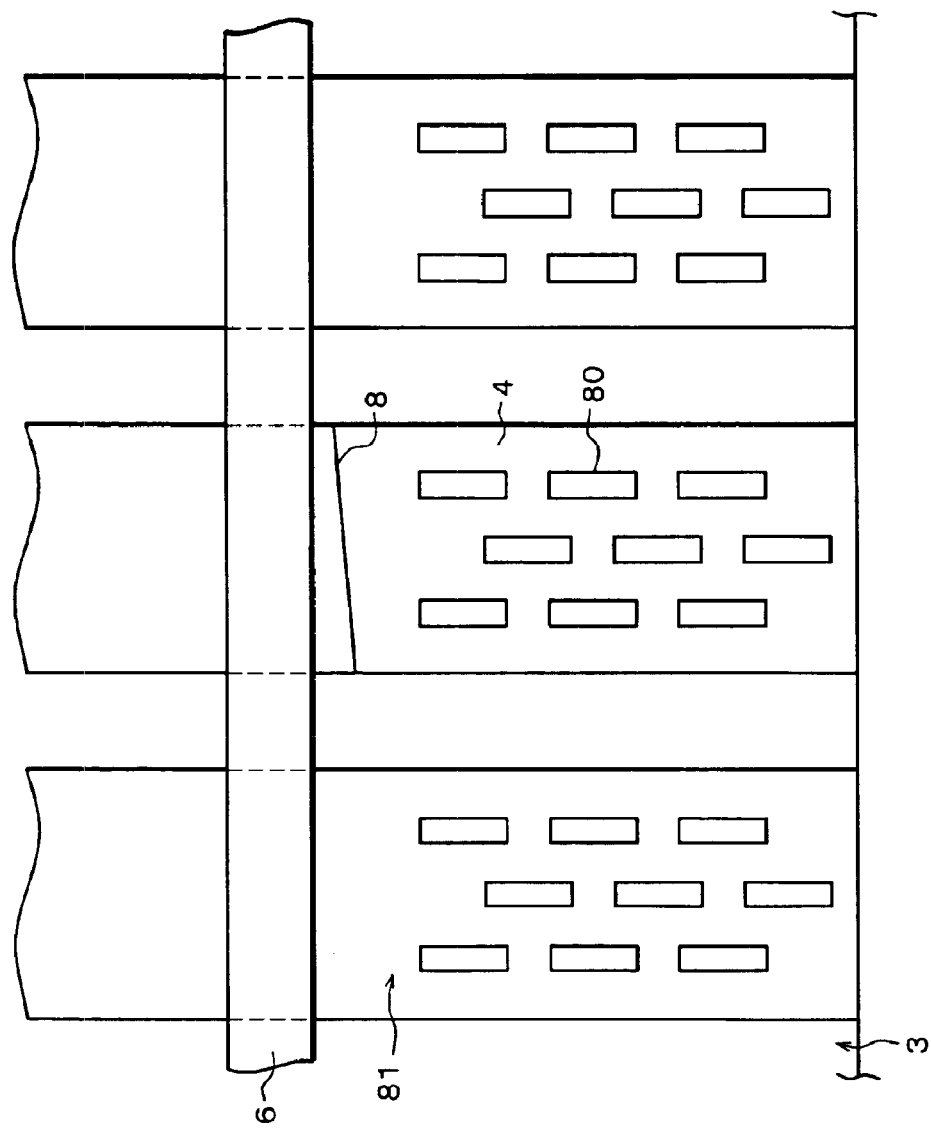
FIG. 19 is a plan view showing a state of a crack formed in a case where the plurality of rectangular slots are provided from the end to a point before the sealing section of the connecting electrode of the liquid crystal display element shown in FIG. 18(a).

That is, as shown in FIG. 18(*c*), when the slots 80 are formed from the end of the connecting electrodes 4 to a point beyond the seal section 6 of the liquid crystal display section 7, the display quality of the liquid crystal display section 7 degrades. Further, when the slots 80 are formed from the end of the connecting electrodes 4 to a point in front of the sealing section 6 of the liquid crystal display section 7 as shown in FIG. 18(*a*), it is impossible to prevent the cracks 8 which occur by the sealing section 6 from penetrating as shown in FIG. 19.

Thus, as in the present embodiment, the slots 80 are formed from the end of the connecting electrodes 4 to the sealing section 6 of the liquid crystal display section 7, so that it is possible to provide the liquid crystal display element which can prevent the disconnection of the connecting electrodes 4 which occurs due to the bend of the substrate 2 brought about in some cases including transport of the liquid crystal display element, without degrading the display quality.

Further, in the liquid crystal display element of the present embodiment, the slots 11 to 17 (FIG. 1, and FIG. 6 to FIG. 11) etc. are formed in the same shape.

Thus, it is easy to provide a plurality of slots 11 to 17 on the connecting electrodes 4.

Further, in the liquid crystal display element of the present embodiment, the slots 21 and 22 (FIG. 12), the slots 31 and 32 (FIG. 13), the slots 41 and 42 (FIG. 14) are formed in different shapes.

That is, as long as the slots 21 and 22, the slots 31 and 32, and the slots 41 and 42 have a crack penetration preventing function, they are not necessarily formed in the same shape.

Thus, in the present embodiment, it is possible to provide the liquid crystal display element which can prevent the disconnection of the connecting electrodes 4 which occurs due to the bend of the substrate 2 brought about in some cases including transport of the liquid crystal display element, in a case where the slots 21 and 22, the slots 31 and 32, and the slots 41 and 42 are formed in different shapes.

Further, in the liquid crystal display element of the present embodiment, a plurality of slots 51 and 52 (FIG. 15(*a*) and FIG. 15(*b*)) are formed in the notched shape on ends in the width direction of the connecting electrodes 4. That is, when a plurality of slots 51 and 52 are provided on the connecting electrodes 4 crosswise, there is a case where the slot is mechanically formed in the notched shape also on the ends in the width direction of the connecting electrodes 4.

However, as long as the connecting electrodes 4 have the crack penetration preventing function, it is possible to provide the liquid crystal display element which can prevent the disconnection of the connecting electrodes 4 which occurs due to the bend of the substrate 2 brought about in some cases including transport of the liquid crystal display element, even when the slots are formed in the notched shape on the ends of the connecting electrodes 4.

Further, in the liquid crystal display element of the present embodiment, a plurality of slots 71 and 72 (FIG. 17(*a*) and FIG. 17(*b*)) are provided so that the length of the slots 71 and 72 is diagonal with respect to the length direction of the connecting electrode 14, and plural lines of the slots are provided in a length direction of the connecting electrode 14. Note that, all the slots 71 may be arranged so that directions of their slopes are the same as shown in FIG. 17(*a*), and the slots 71 and 72 in adjacent lines may be arranged so that directions of their slopes are different as shown in FIG. 17(*b*).

Also in this structure, as long as the slots 71 and 72 have a crack penetration preventing function, it is possible to provide the liquid crystal display element which can prevent the disconnection of the connecting electrodes 4 which occurs due to the bend of the substrate 2 brought about in some cases including transport of the liquid crystal display element.

Figure 23:
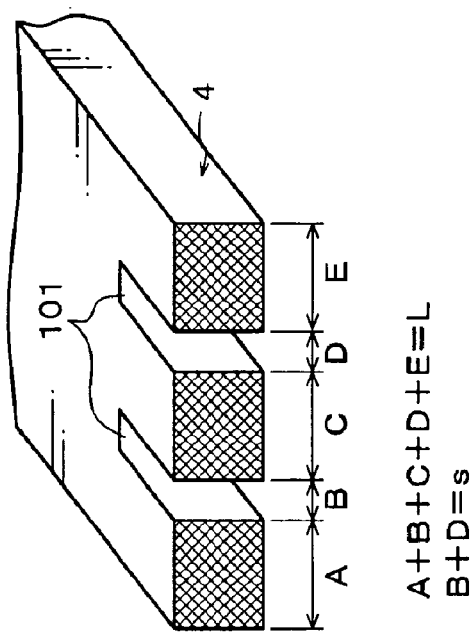
FIG. 23(a) is a plan view of an important portion concerning the plural rectangular slots formed on the connecting electrode of the liquid crystal display element, and shows the total width of slots placed in a straight line which is parallel with respect to a width direction of the connecting electrode, and shows the width of the connecting electrode.
FIG. 23(b) is a strabismus view showing an important portion which includes a cross section of the connecting electrode cut in a width direction, and shows the total width of the slots and the width of the connecting electrode.
Figure 23:
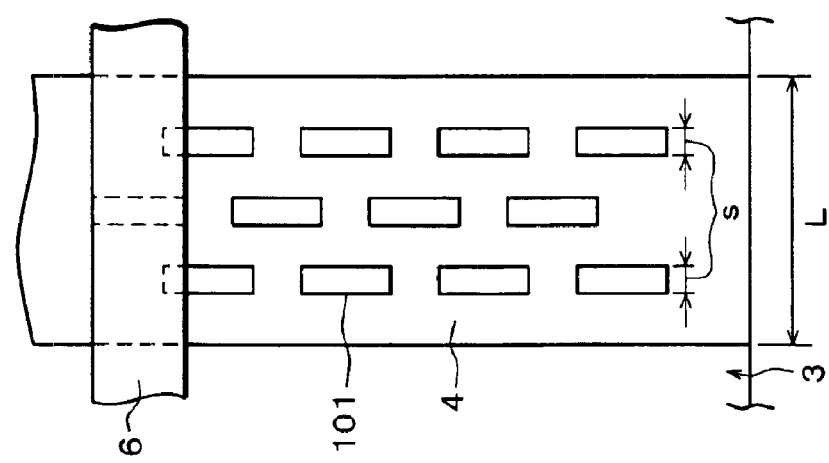

Further, in the liquid crystal display element, the ratio of the total width of the slots 101 (FIG. 23(*a*) and FIG. 23(*b*)), of which at least one slot is provided on a straight line which is parallel with respect to the width direction of the connecting electrode 4, with the width of the connecting electrode 4 is more than 0 and not more than 1/10.

Thus, it is possible to provide the liquid crystal display element which can prevent the disconnection of the connecting electrodes 4 which occurs due to the bend of the substrate 2 brought about in some cases including transport of the liquid crystal display element, without raising a threshold value voltage largely.

Further, in the liquid crystal display element of the present embodiment, the slots 121 and 122 (FIG. 24(*b*)) which are adjacent to each other in the width direction of the connecting electrodes 4 are provided in staggered manner so that a slope of a straight line passing through the nearest apices of the adjacent slots is not less than 30° and not more than 90° with respect to the width direction of the connecting electrode 4 of the liquid crystal element.

That is, the cracks 8 which occur due to the bend of the substrate 2 brought about in some cases including transport of the liquid crystal display element occur in a linear manner with a slope of 0° to about 20° in the width direction of the connecting electrodes 4.

Thus, as in the present embodiment, the slots 121 and 122 which are adjacent with each other in the width direction of the connecting electrodes 4 are provided in staggered manner so that a slope of a straight line passing through the nearest apices of the adjacent slots is not less than 30° and not more than 90° with respect to the width direction of the connecting electrode 4 of the liquid crystal element, so that it is possible to prevent the connecting electrodes 4 from being penetrated with any one of the slots 121 and 122 without fail, even when the cracks 8 occur in a linear manner with a slope of 0° to about 20°.

As a result, it is possible to provide the liquid crystal display element which can unfailingly prevent the disconnection of the connecting electrodes 4 which occurs due to the bend of the substrate 2 brought about in some cases including transport of the liquid crystal display element.

Note that, it is possible to obtain the same effect by forming the slots 121 and 122 in staggered manner so that a slope of a straight line passing through the nearest apices of the adjacent slots is not less than 30° and not more than 90° with respect to the width direction of the connecting electrode 4 of the liquid crystal element.

Further, in the liquid crystal display element of the present embodiment, the width of one slot 91 (FIG. 20) of the connecting electrodes 4 is not less than 1.5 µm. The width is suitable for preventing the cracks 8 from penetrating the connecting electrodes 4.

Further, in the liquid crystal display element of the present embodiment, slots 11 of the connecting electrodes 4 are formed by using laser beam. By this, even after the connecting electrodes 4 are formed, it is possible to form the slots 11 on the connecting electrodes 4 easily. Further, the strength of the laser beam can be adjusted, so that it is possible to form the slots 11 so that holes are not formed on the substrate 2.

Figure 25:
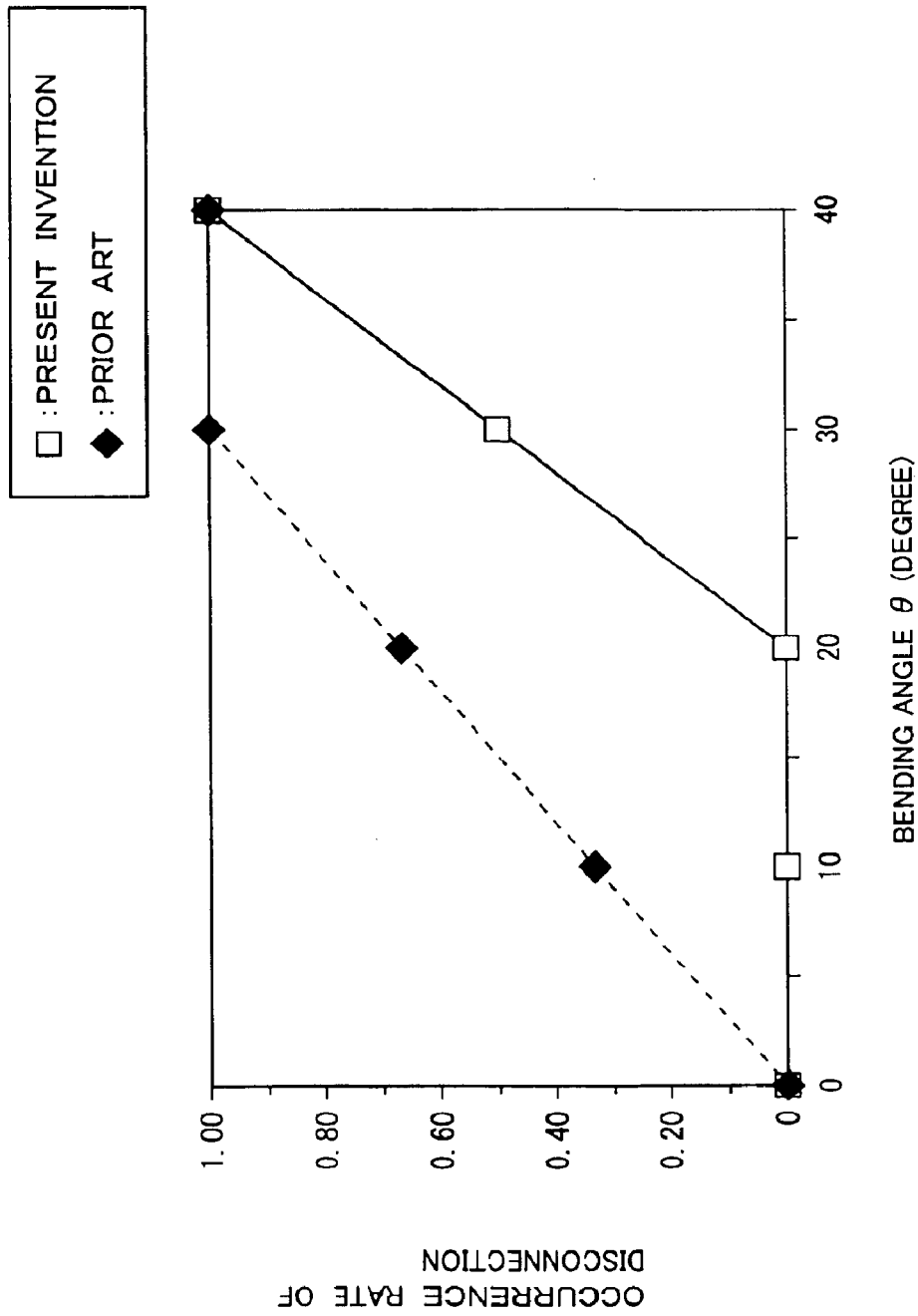
FIG. 25 is a graph showing the occurrence ratio of the disconnection in the liquid crystal display element with respect to a bending angle θ of the terminal section.
Figure 26:
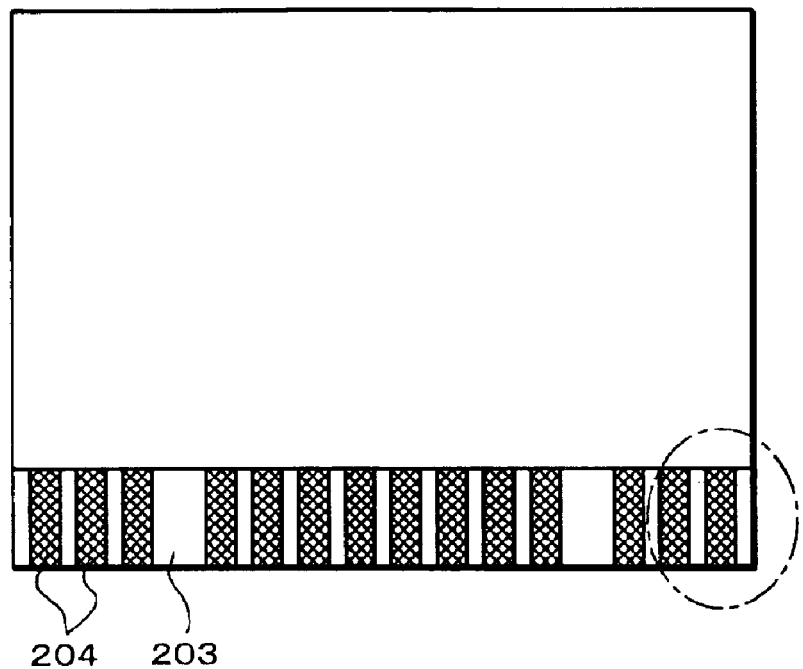
FIG. 26(a) is a plan view showing a structure of a conventional liquid crystal display element.
FIG. 26(b) is a strabismus view of an important portion specifically showing a portion which is surrounded by an alternate long and short dash line in FIG. 26(a).
Figure 26:
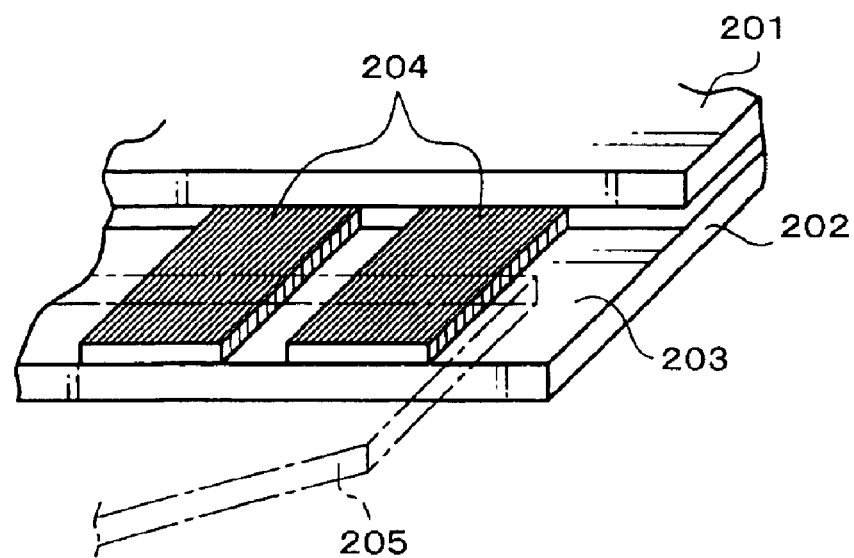
Figure 27A:
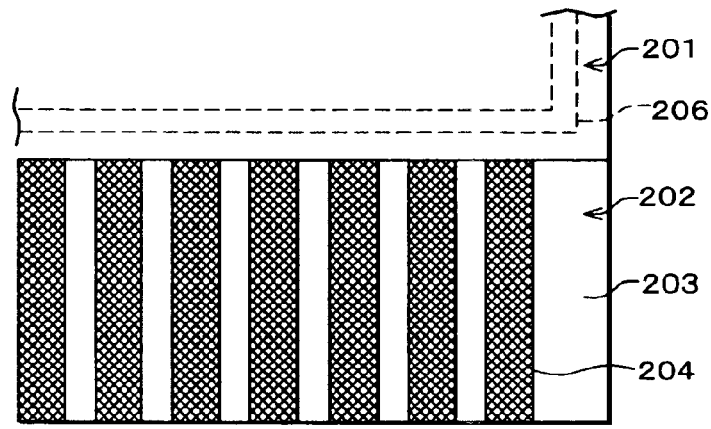
FIG. 27(a) is a plan view showing a structure of a conventional liquid crystal display element.
Figure 27B:
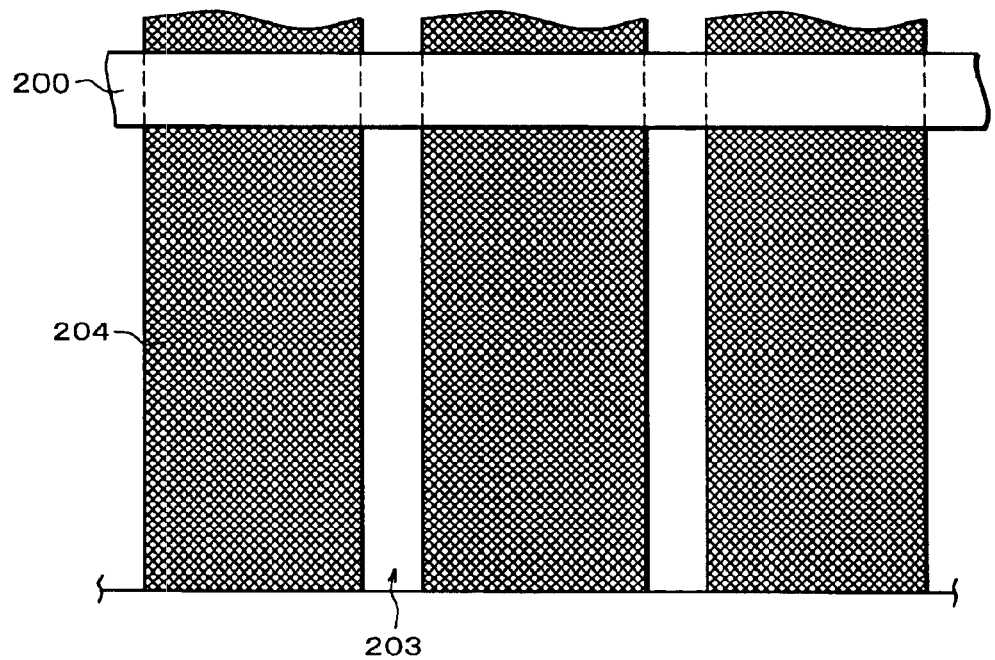
FIG. 27(b) is a plan view of an important portion of the structure.
Figure 28:
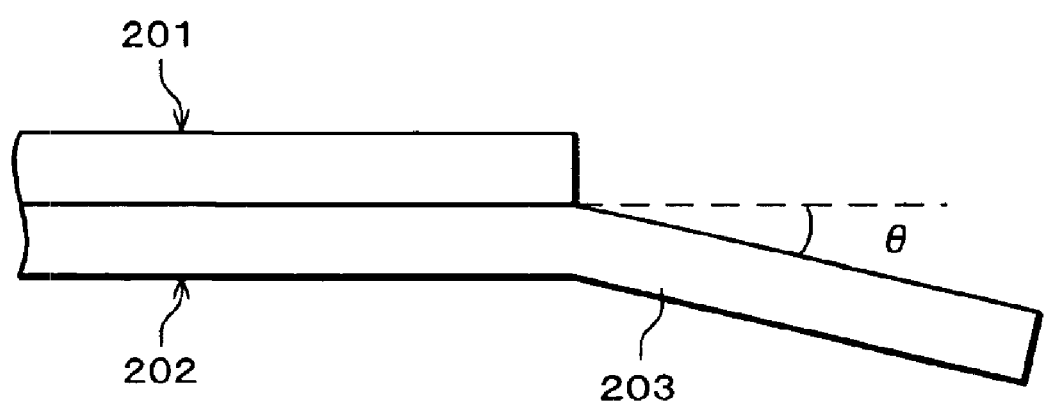
FIG. 28 is a side view showing a state in which a terminal section in a substrate of the liquid crystal display element is bent.
Figure 29:
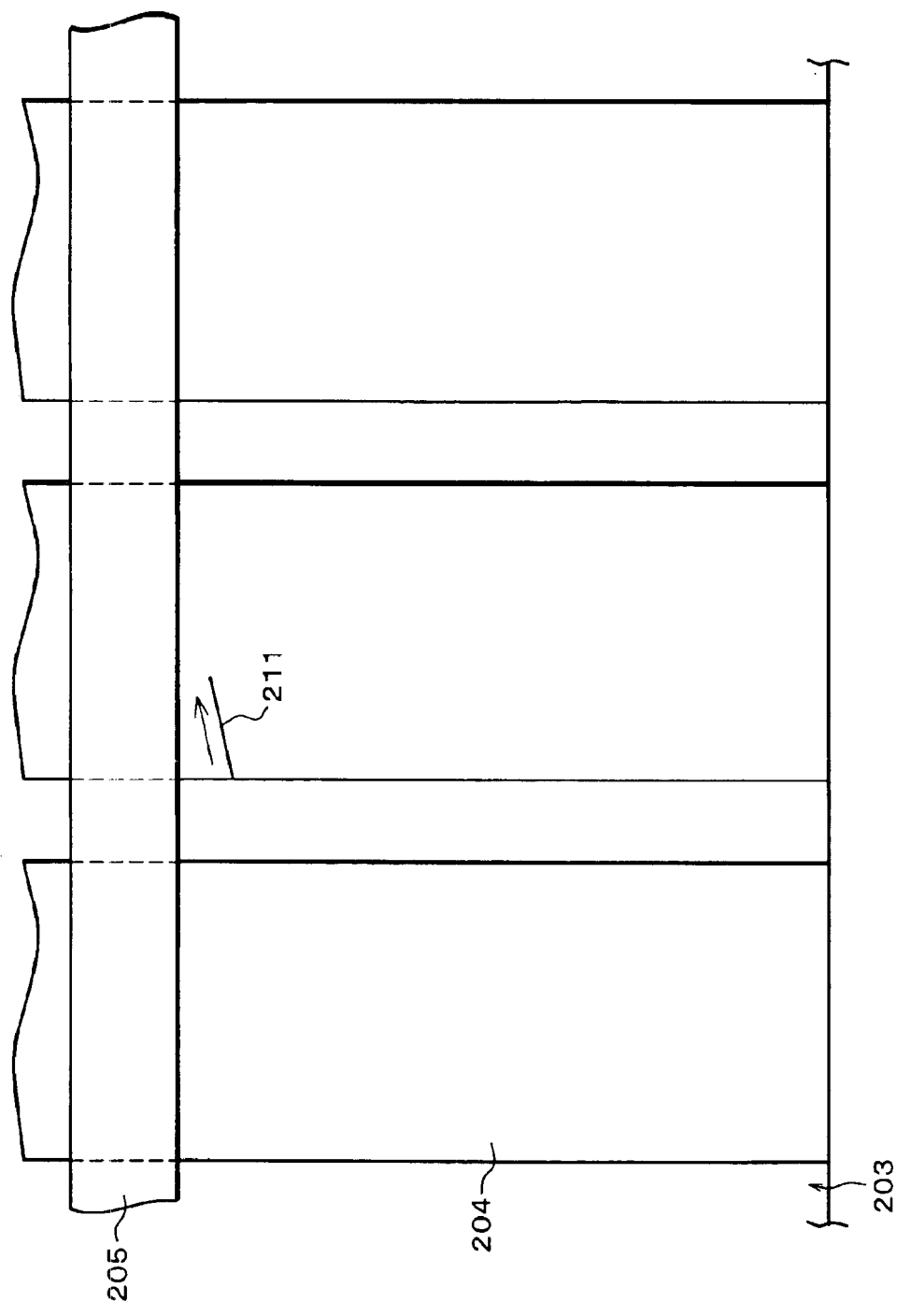
FIG. 29 is a plan view showing a crack which occurs in the liquid crystal display element.

FIG. 25 is a graph showing the occurrence ratio of the disconnection brought about by the cracks 8 with respect to the bending angle $\theta$ of the terminal section An abscissa shows the bending angle $\theta$, and an ordinate shows the occurrence ratio of the disconnection. In the graph, the liquid crystal display element according to the present invention is described with a continuous line and void squares, and a conventional liquid crystal display element is described with a broken line and black rhomboids.

When a slope of the conventional liquid crystal display element is referred to in the graph, the following facts can be confirmed. That is, when the terminal section is bent a bit, the disconnection occurs. The larger the bending angle $\theta$ becomes, the higher the occurrence ratio of the disconnection becomes. And when the bending angle $\theta$ is not less than 30°, the disconnections occur in all the liquid crystal display element.

On the other hand, when a slope of the liquid crystal display element of the present invention is referred to in the graph, the following facts can be confirmed. That is, when the bending angle $\theta$ is not more than 20°, the disconnection does not occur. When the bending angle $\theta$ is more than 20°, the disconnection occurs, and the larger the bending angle $\theta$ becomes, the higher the occurrence ratio of the disconnection becomes. When the bending angle $\theta$ is not less than 40°, the disconnections occur in all the liquid crystal display element.

Thus, the liquid crystal display element of the present invention is superior to the conventional liquid crystal display element in that the occurrence ratio of the disconnecting is low when the bending angle $\theta$ is not more than 40°. Particularly, when the bending angle is not more than 20°, no disconnection occurs. Thus, FIG. 25 shows that the liquid crystal display element of the present invention is superior to the conventional liquid crystal display element.

As to the liquid crystal display element of the foregoing embodiment, various experiments were performed in various embodiments so as to confirm its effects. The results are shown in the first to thirteenth embodiments. Further, as to the conventional liquid crystal display element, experiments were performed so as to compare it with the liquid crystal display element of the present invention.

[First Embodiment]

First, a plastic substrate made of a PES (Poly Ether Sulphone) having 0.2 mm thickness was used as substrates 1 and 2, and an ITO having 1400 Å thickness was used as the connecting electrodes 4. Then, as shown in FIG. 1, the connecting electrodes 4 having a slots group 10 made up of the plurality of rectangular slots 11 were formed on the substrate 2 by a photo process. Thereafter, according to an ordinary liquid crystal display element forming process, the liquid crystal display element was made. And, as shown in FIG. 4, the terminal section 3 is bent so as to measure the bending angle $\theta$ at which the disconnection occurs in the connecting electrodes 4.

As a result, as shown in FIG. 5(a), when the bending angle $\theta$ was 20°, the crack 8 occurred partially, but it did not bring about the complete disconnection. However, as shown in FIG. 5(b), when the bending angle $\theta$ was 30°, the complete disconnection occurred, and the cracks 8 which penetrated the connecting electrodes 4 in the width direction occurred in a disconnecting portion.

COMPARATIVE EXAMPLE

A liquid crystal display element as the comparative example was made by the same process as in the first embodiment except for the plurality of rectangular slots 11 shown in FIG. 1. That is, an experiment was performed by using a conventional liquid crystal display element.

Figure 30:
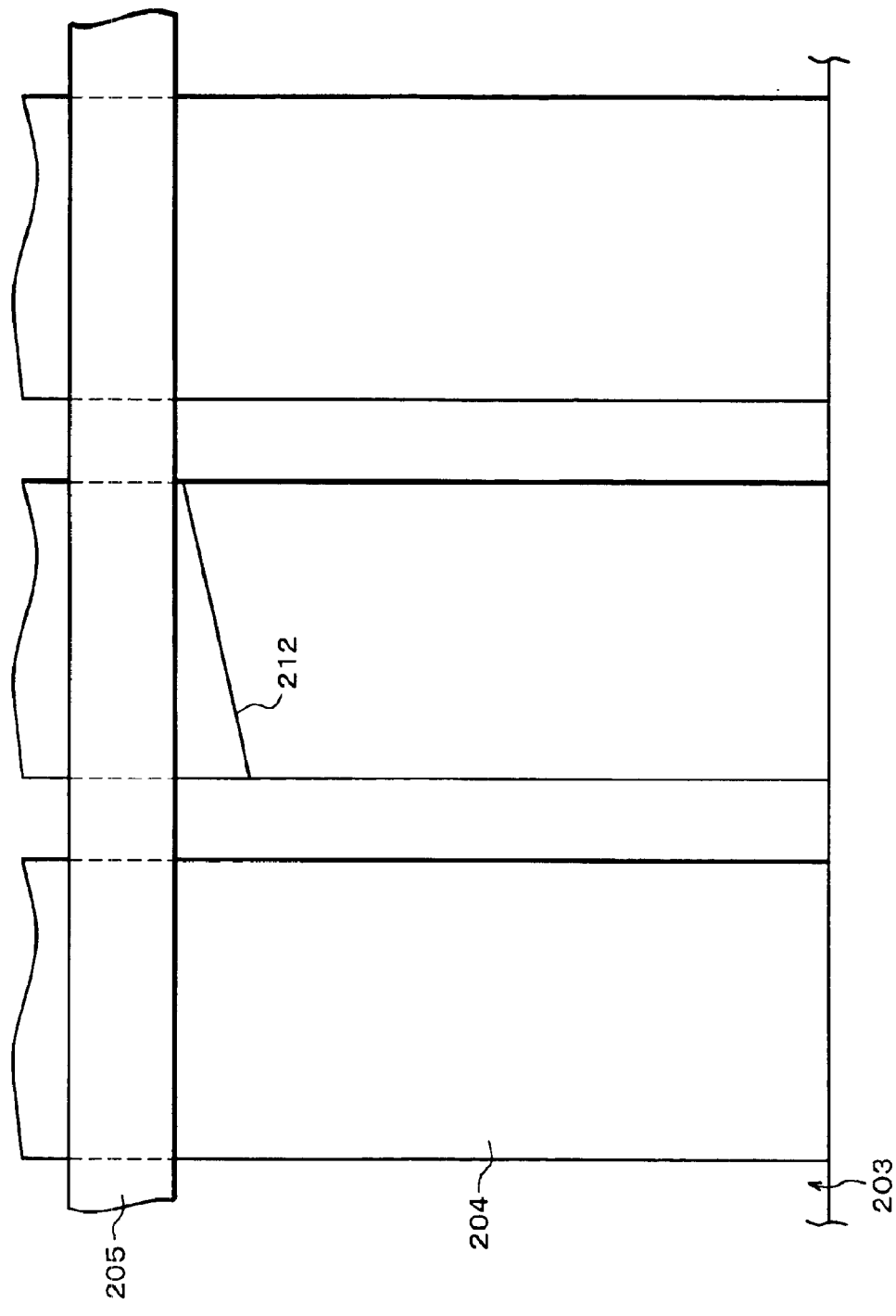
FIG. 30 is a plan view showing a crack which penetrates a connecting electrode in a case where the liquid crystal display element is bent 20°.

As a result, as shown in FIG. 30, the bending angle $\theta$ of the terminal section 203 at which the disconnection occurred in the connecting electrodes 204 was 20°. Cracks 212 which penetrated the connecting electrodes 204 in the width direction occurred in a disconnecting portion.

Thus, it turned out that, compared with the comparative example, the liquid crystal display element of the first embodiment was superior in that the bending angle $\theta$ of the terminal section at which the cracks occurred in the connecting electrodes was larger. That is, a structure in which the plurality of slots 11 were provided was strong against the bend.

[Second Embodiment]

Figure 6:
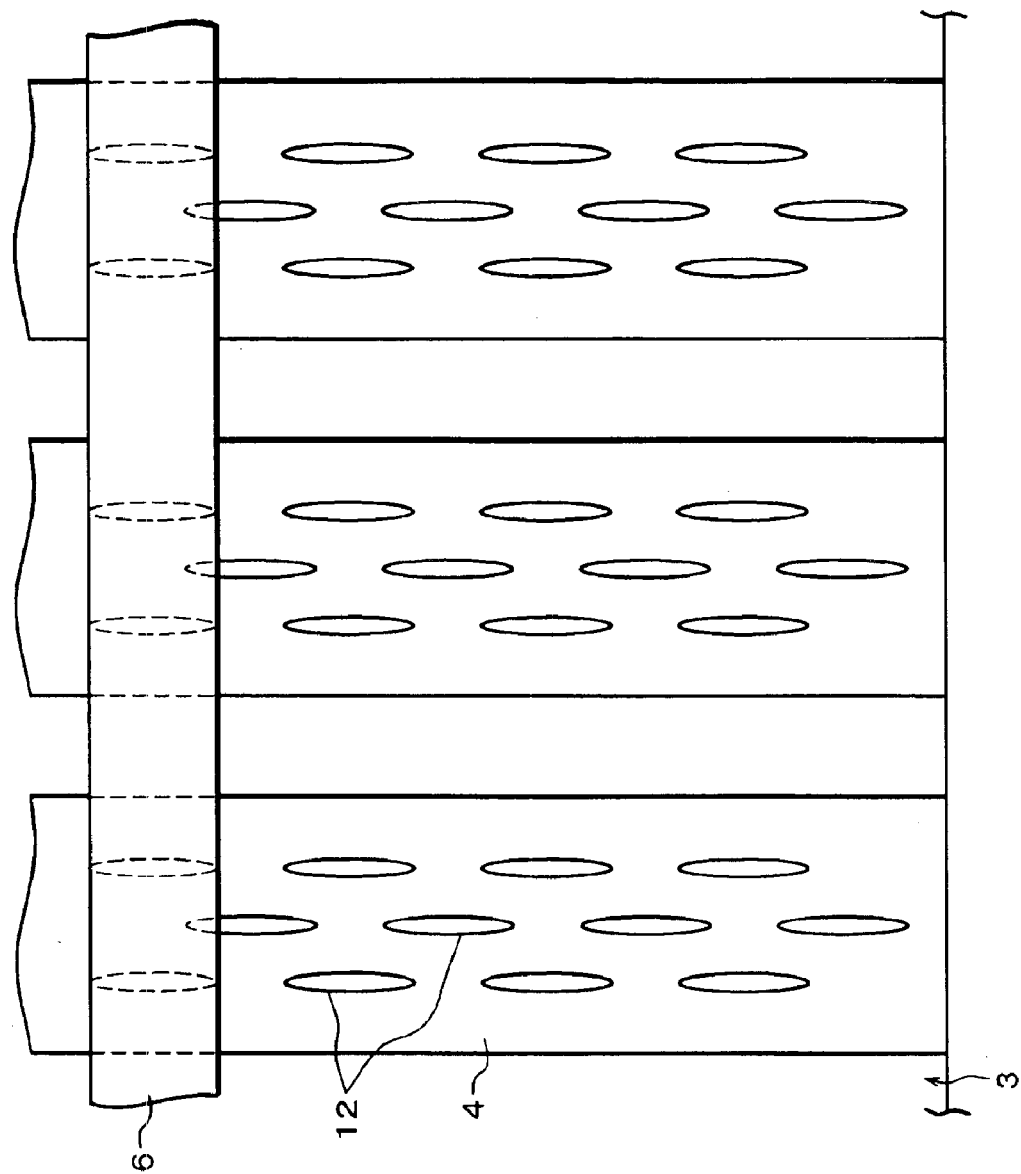
FIG. 6 is a plan view showing a state in which a plurality of oval slots are formed on the connecting electrodes of the liquid crystal display element.

As in the first embodiment, a plurality of oval slots 12 were provided on the connecting electrodes 4 as shown in FIG. 6. As a result, as in the first embodiment, when the terminal section 3 was bent so that the bending angle $\theta$ of the terminal section 3 was 30°, the cracks 8 occurred in the connecting electrodes 4 and the disconnection was brought about.

Thus, it turned out that, compared with the conventional liquid crystal display element in which the disconnection occurred at the bending angle $\theta$ of 20°, a structure in which the plurality of oval slots 12 shown in FIG. 6 were provided was strong against the bend.

[Third Embodiment]

Figure 7:
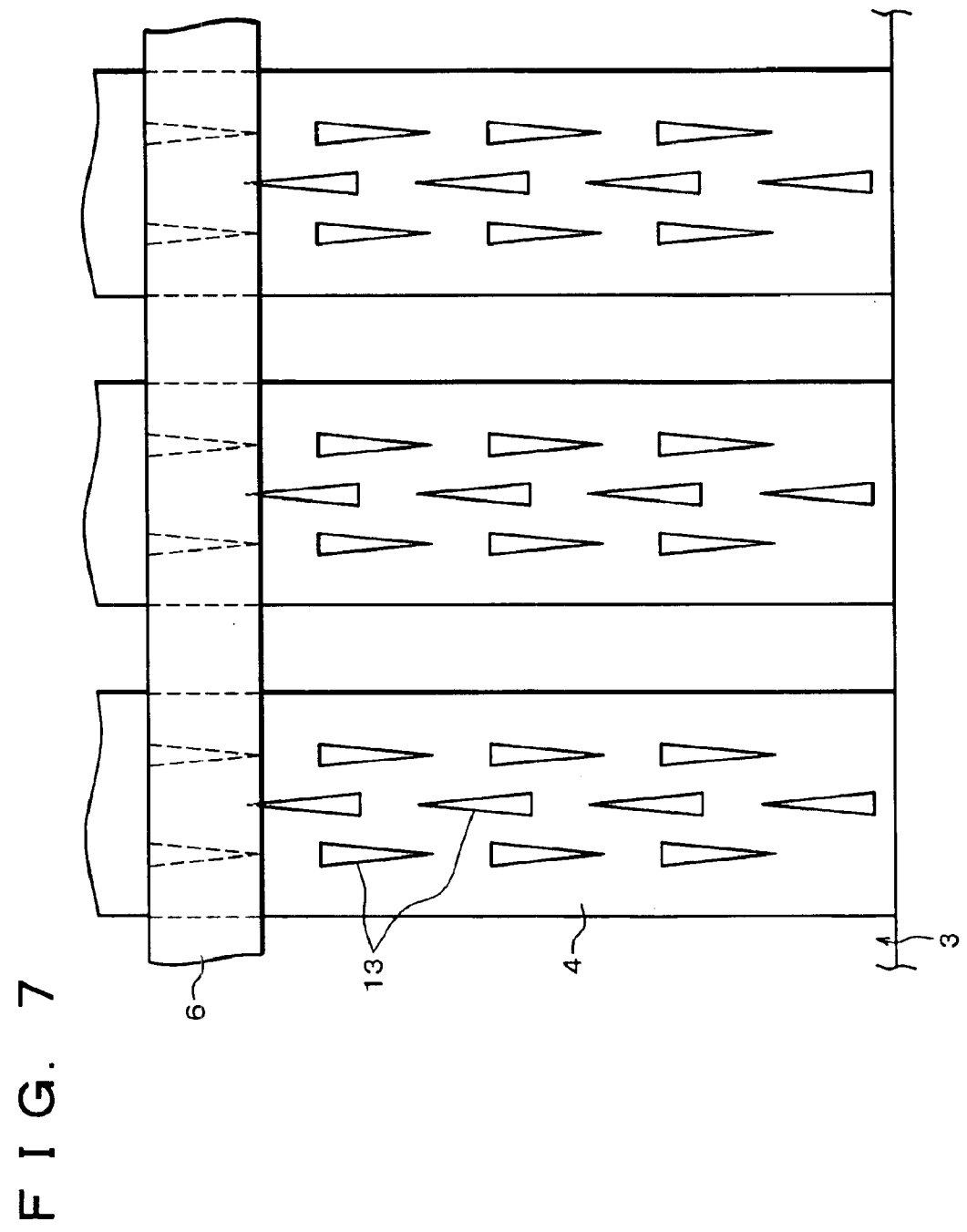
FIG. 7 is a plan view showing a state in which a plurality of triangular slots are formed on the connecting electrodes of the liquid crystal display element.
Figure 8:
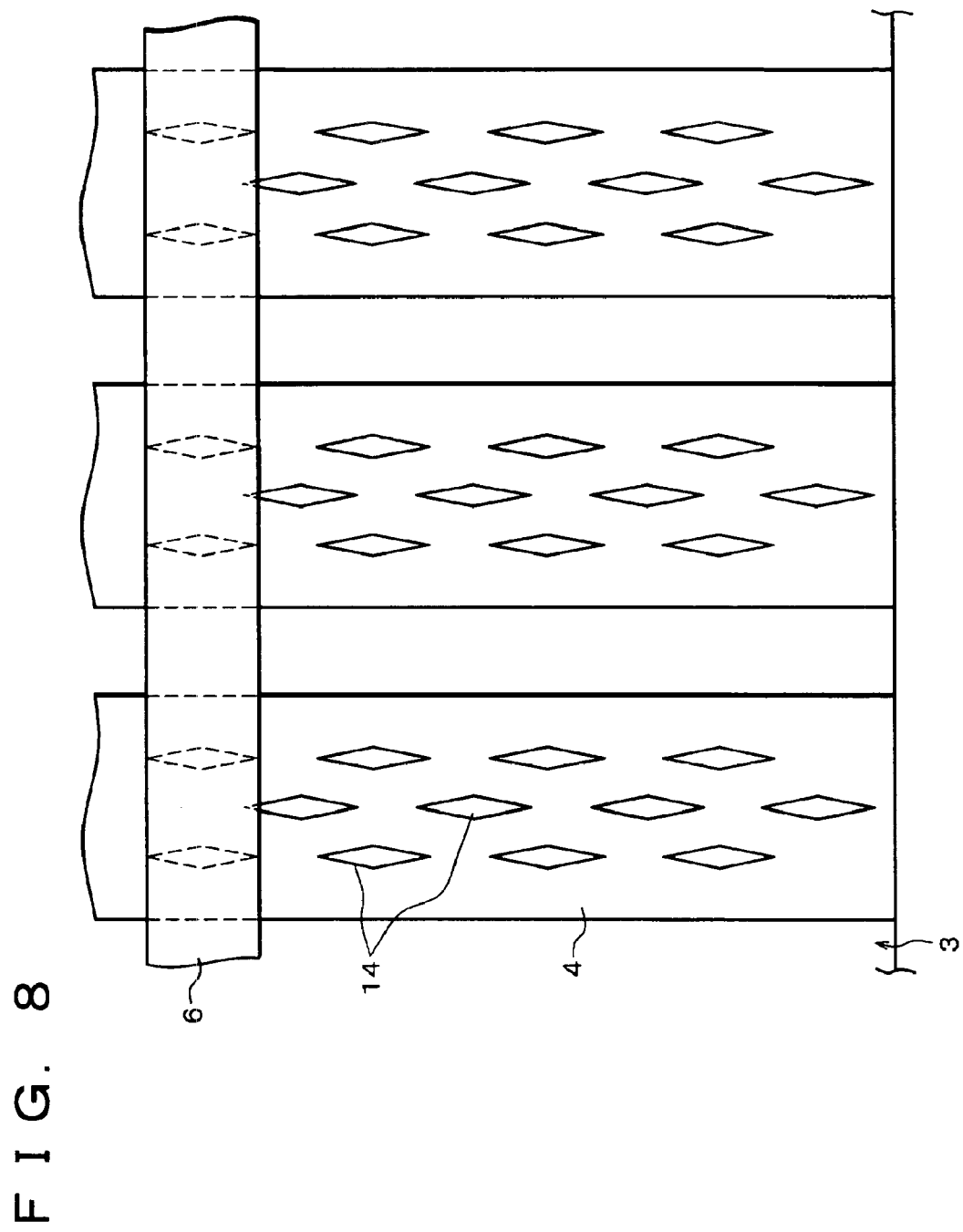
FIG. 8 is a plan view showing a state in which a plurality of rhombic slots are formed on the connecting electrodes of the liquid crystal display element.

As in the first embodiment, as shown in FIG. 7 to FIG. 11, slots 13, 14, 15, 16, and 17 whose shapes were triangular (FIG. 7), rhomboid (FIG. 8), hexagonal (FIG. 9), temple-bell-shaped (FIG. 10), and figure-8-shaped (FIG. 11) respectively, were provided on the connecting electrodes 4.

As a result, as in the first embodiment, when the terminal section 3 were bent respectively so that the bending angle $\theta$ of the terminal section 3 was 30°, the cracks 8 occurred in the connecting electrodes 4 and the disconnections were brought about respectively.

Thus, it turned out that, compared with the conventional liquid crystal display element in which the disconnection occurred at the bending angle $\theta$ of 20°, a structure in which a plurality of slots 13, 14, 15, 16, and 17 whose shapes were triangular, rhomboid, hexagonal, temple-bell-shaped, and figure-8-shaped in FIG. 7, FIG. 8, FIG. 9, and FIG. 10 respectively were provided was strong against the bend.

Figure 9:
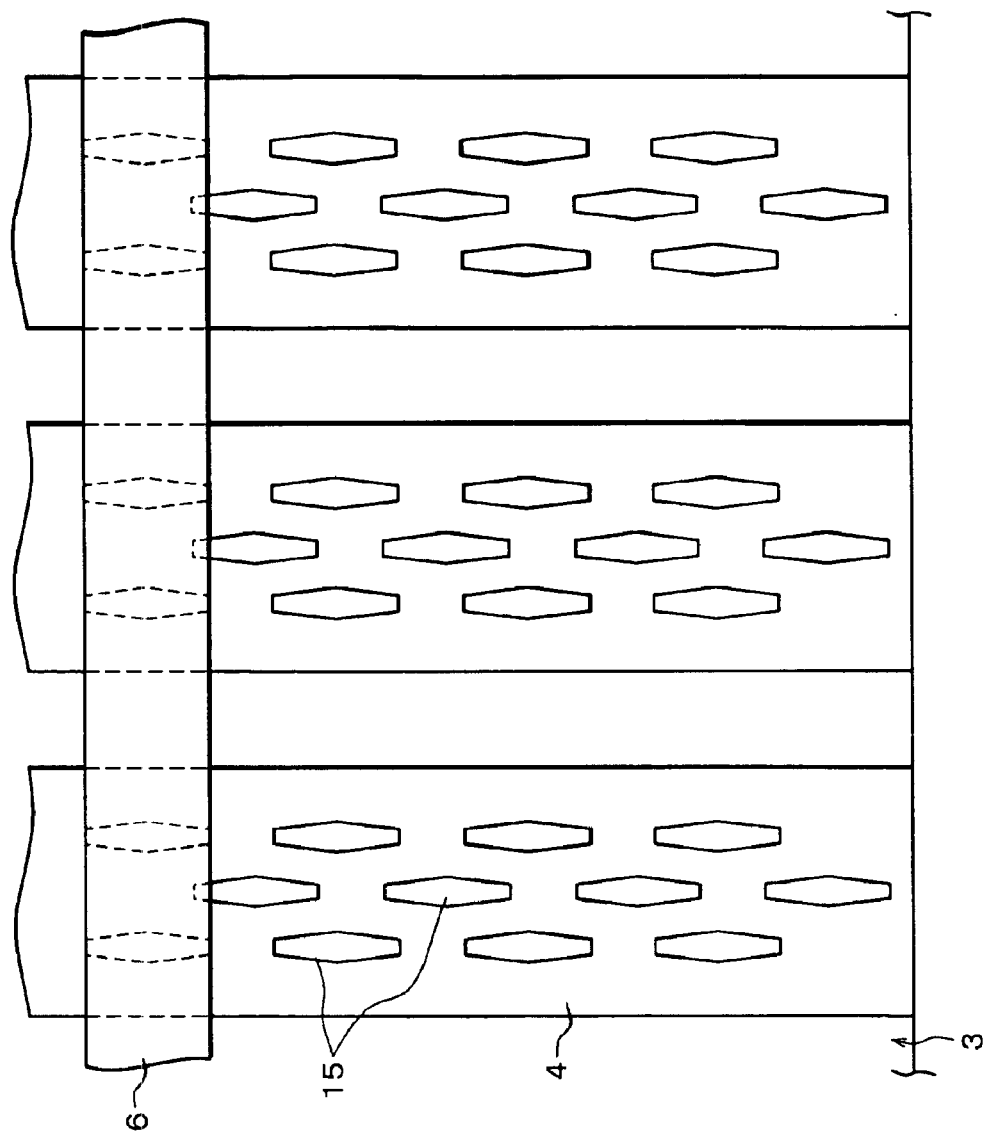
FIG. 9 is a plan view showing a state in which a plurality of hexagonal slots are formed on the connecting electrodes of the liquid crystal display element.
Figure 10:
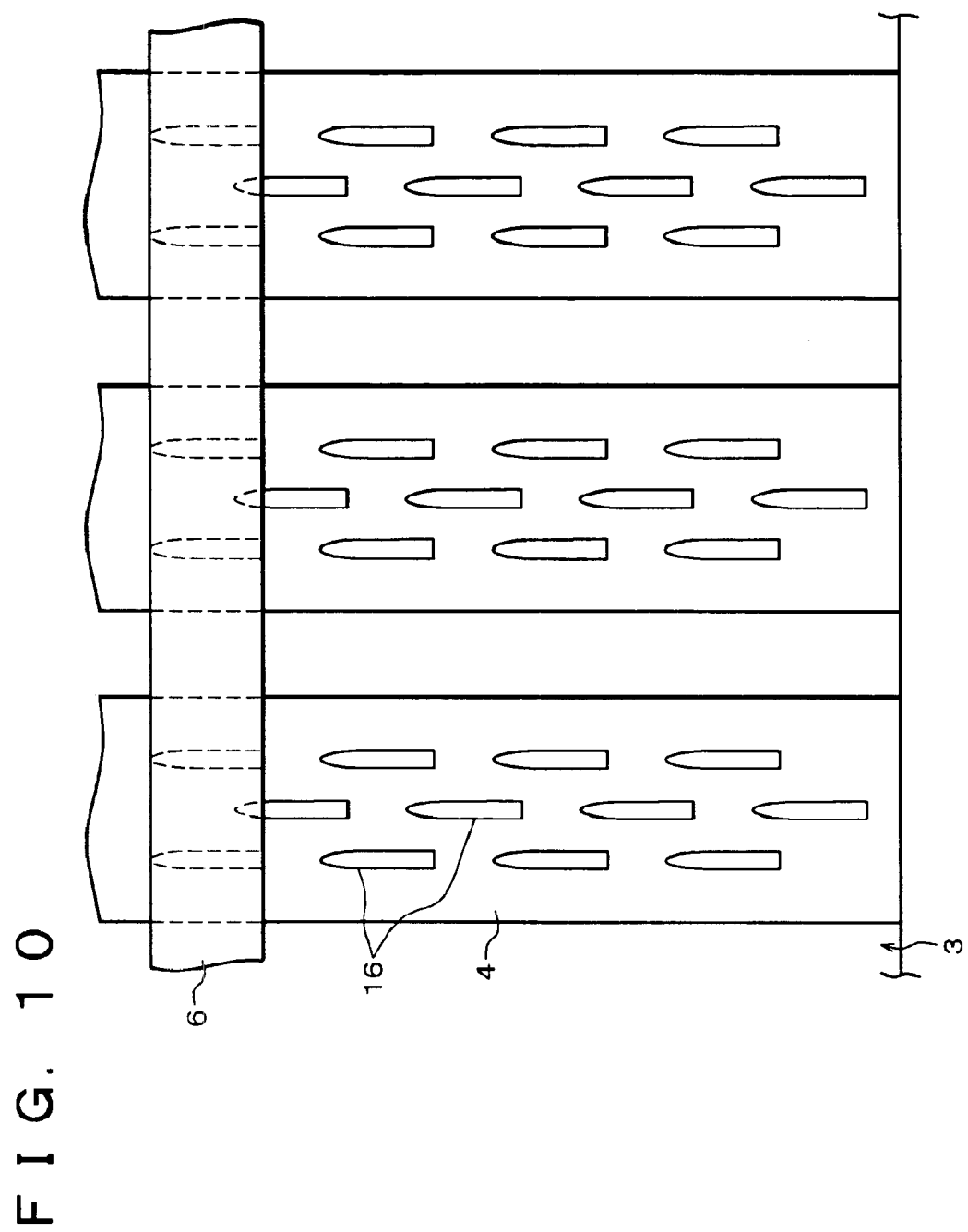
FIG. 10 is a plan view showing a state in which a plurality of temple-bell-shaped slots are formed on the connecting electrodes of the liquid crystal display element.
Figure 11:
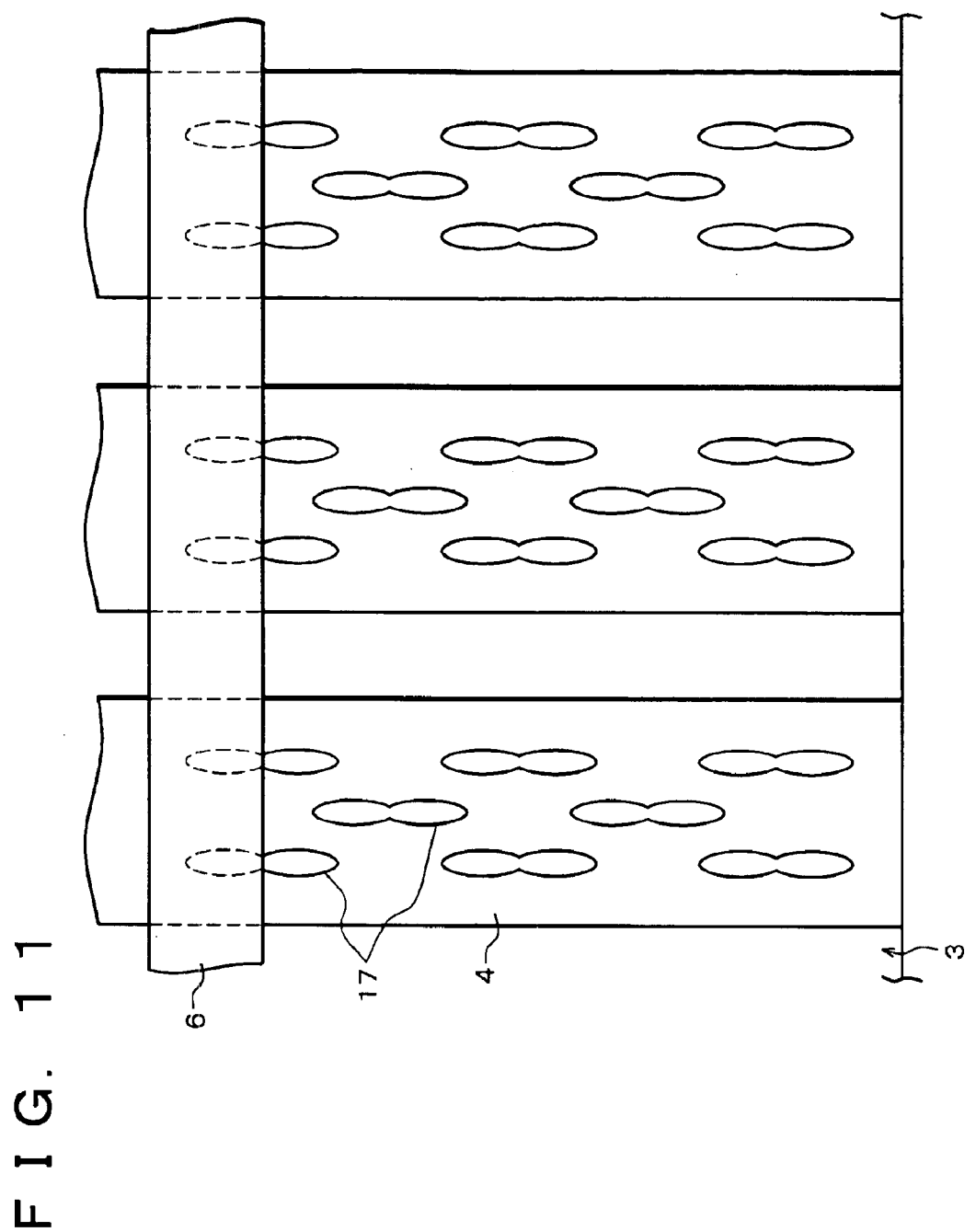
FIG. 11 is a plan view showing a state in which a plurality of figure-8-shaped slots are formed on the connecting electrodes of the liquid crystal display element.

Further, as shown in FIG. 7, FIG. 8, and FIG. 9, the slots of triangles, rhomboids, and hexagons gave the effective results. Thus, slots whose shapes are polygon other than the shapes shown in FIG. 7, FIG. 8, and FIG. 9 may be formed.

Further, the rectangular slots whose corners were round and the figure-8-shaped slots gave the effective results. Thus, it is possible to provide slots whose shapes are formed by combining polygons and ellipses other than the shapes of the slots shown in FIG. 10 and FIG. 11.

[Fourth Embodiment]

Figure 12:
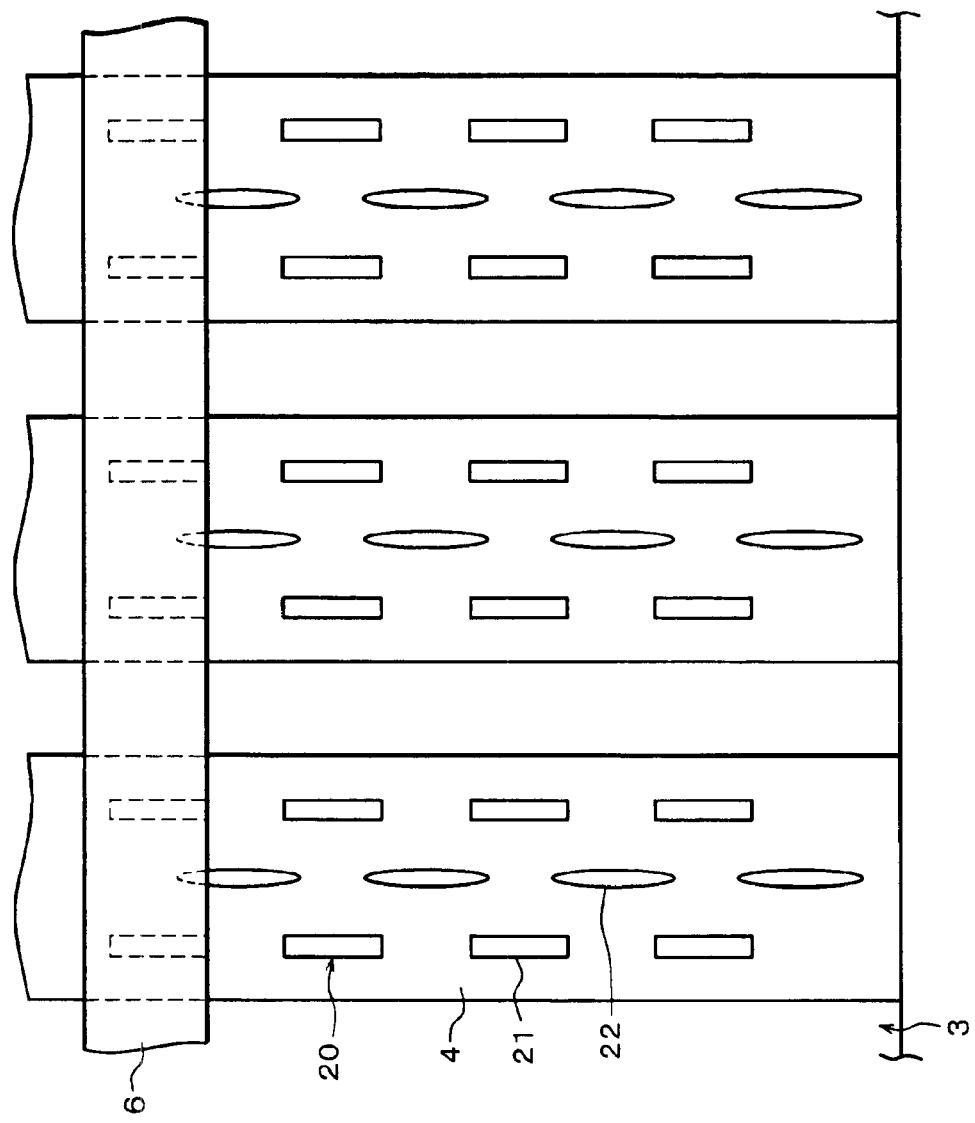
FIG. 12 is a plan view showing a state in which the plurality of rectangular slots and the plurality of oval slots are formed on the connecting electrodes of the liquid crystal display element.

As shown in FIG. 12, a slots group 20 which were formed by combining a plurality of rectangular slots 21 and a plurality of oval slots 22 was provided on the connecting electrodes 4.

As a result, as in the first embodiment, when the terminal section 3 was bent so that the bending angle θ of the terminal section 3 was 30°, the disconnection was brought about in the connecting electrodes 4. Further, the shape of the slots of FIG. 12 gave the effective results. Thus, polygons and ellipses may be combined other than rectangles and ellipses of FIG. 12 so as to form slots.

[Fifth Embodiment]

Figure 13:
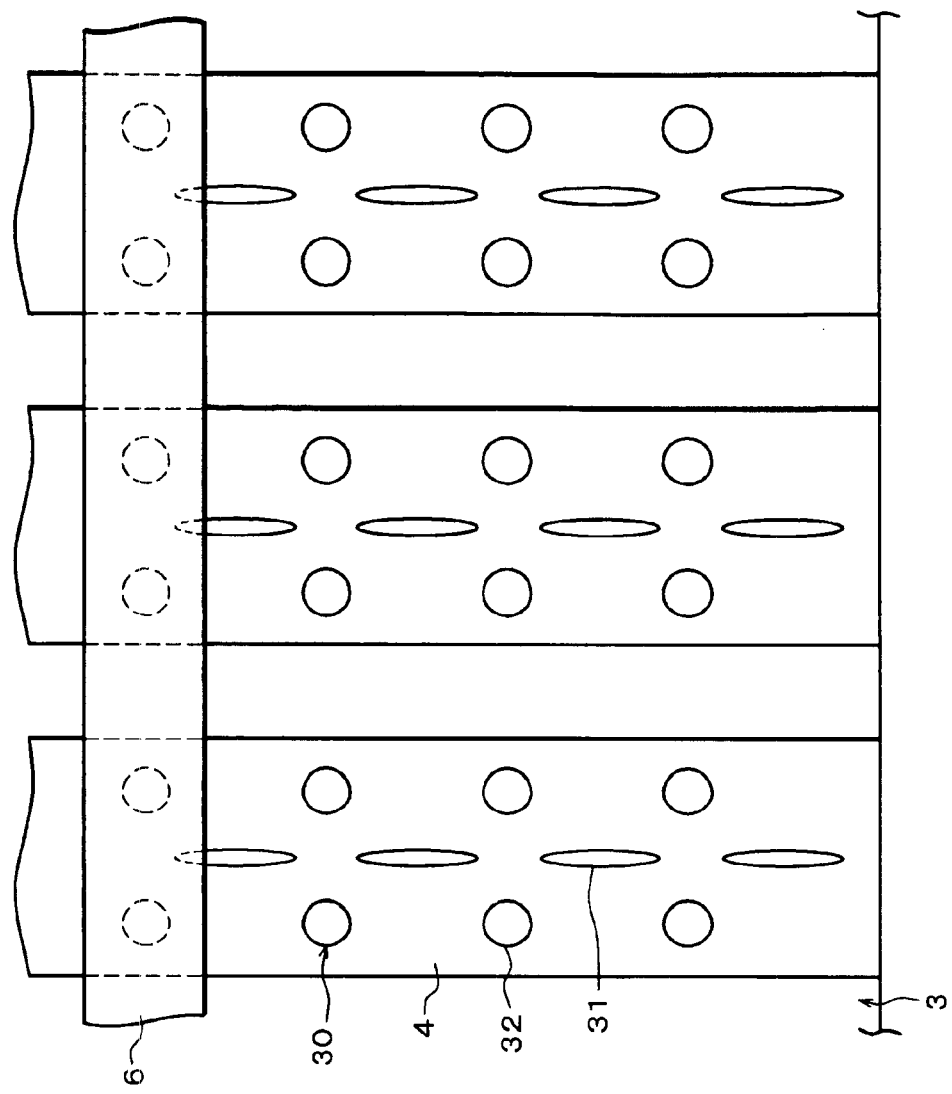
FIG. 13 is a plan view showing a state in which a plurality of circular slots and the plurality of oval slots are formed on the connecting electrodes of the liquid crystal display element.
Figure 14:
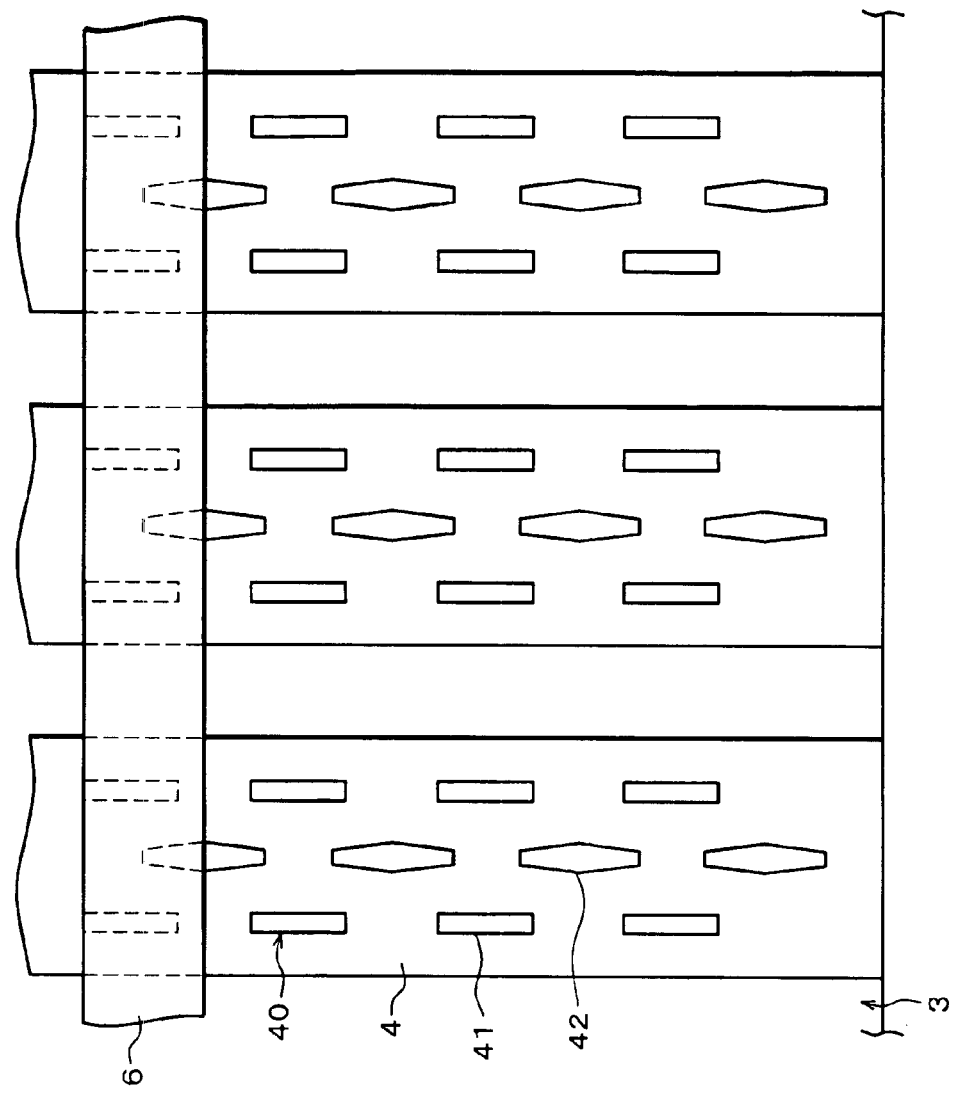
FIG. 14 is a plan view showing a state in which the plurality of rectangular slots and the plurality of hexagonal slots are formed on the connecting electrodes of the liquid crystal display element.

As shown in FIG. 13, a slots group 30 which were formed by combining a plurality of oval slots 31 and a plurality of circle slots 32 was provided on the connecting electrodes 4. Further, as shown in FIG. 14, a slots group 40 which were formed by combining a plurality of rectangular slots 41 and a plurality of hexagonal slots 42 was provided on the connecting electrodes 4. As a result, as in the first embodiment, when the terminal section 3 was bent so that the bending angle θ of the terminal section 3 was 30°, the disconnection was brought about in the connecting electrodes 4.

As a result, it turned out that the slots group 30 shown in FIG. 13 which was arranged by combining the plural oval slots 31 and the plural circle slots 32, and the slots group 40 shown in FIG. 14 which was arranged by combining the plural rectangular slots 41 and the plural hexagonal slots 42 were strong against the bend, unlike the conventional liquid crystal display element in which the disconnection occurred when the terminal section 3 was bent so that the bending angle θ of the terminal section 3 was 20°.

Further, the slots group 30 and the slots group 40 whose shapes are shown in FIG. 13 and FIG. 14 gave the effective results. Thus, ellipses other than the ellipses of FIG. 13 and ellipses (circle) may be combined so as to form slots. Further, rectangles other than the rectangles shown in FIG. 14 and hexagons may be combined so as to form the slots.

[Sixth Embodiment]

As shown in FIG. 15(*a*), a slots group 50 was formed with some of hexagonal slots 51 formed in the notched shape on both sides in the width direction of the connecting electrodes 4. Further, as shown in FIG. 15(*b*), it is also possible to form the slots group 50 with some of the oval slots 52 formed in the notched shape on both ends in the width direction of the connecting electrodes 4.

As in the first embodiment, when the terminal section 3 was bent so that the bending angle θ of the terminal section 3 was 30°, the cracks 8 was brought about in the connecting electrodes 4.

As a result, it turned out that, a structure of the slots group 50 in which some of the hexagonal slots 51 were formed in the notched shape on the ends in the width direction of the connecting electrodes 4 as shown in FIG. 15(*a*) and some of the oval slots 50 were formed in the notched shape on ends in the width direction of the connecting electrodes 4 as shown in FIG. 15(*b*) were strong against the bend, unlike the conventional liquid crystal display element in which the disconnection occurred when the terminal section 3 was bent so that the bending angle θ of the terminal section 3 was 20°.

Further, the shape of the slots of the slots group 50 shown in FIG. 15(*a*) and FIG. 15(*b*) gave the effective results. Thus, some of shapes other than the shapes shown in FIG. 15(*a*) and FIG. 15(*b*) may be formed in the notched shape on the ends in the width direction of the connecting electrodes 4.

[Seventh Embodiment]

As shown in FIG. 16, a slots group 60 was formed by providing rectangular slots 61 on the connecting electrodes 4 at random, and the terminal section 3 was bent as in the first embodiment.

As a result, when the terminal section 3 was bent so that the bending angle θ of the terminal section 3 was 25°, the cracks 8 occurred in the connecting electrodes 4 and the disconnection was brought about.

Thus, it turned out that the liquid crystal display device of the present embodiment was more effective than a conventional liquid crystal display element, but the layout of the slots group 10 shown in FIG. 1 is more preferable.

[Eighth Embodiment]

As shown in FIG. 17(*a*), a slots group 70 was formed by providing rectangular slots 71 on the connecting electrodes 4 diagonally. Further, as shown in FIG. 17(*b*), a slots group 70 was formed by providing rectangular slots 71 and 72 diagonally in staggered manner on the connecting electrodes 4 so that directions of their slopes are different. Then, as in the first embodiment, the terminal section 3 was bent. When the terminal section 3 was bent so that the bending angle θ was 20°, the disconnection did not occur, and when the bending angle θ was 30°, the disconnection occurred.

In the conventional liquid crystal display element, when the terminal section is bent so that the bending angle θ is 20°, the disconnection occurs. Thus, it turned out that the slots group 70 whose structure was shown in FIG. 17(*a*) and FIG. 17(*b*) was strong against the bend.

Further, as shown in FIG. 17(*a*), the rectangular slots 71 may be provided diagonally otherwise than the foregoing diagonal layout. Further, as shown in FIG. 17(*b*), the slots 71 and 72 may be provided diagonally otherwise than the foregoing layout in which the slots 71 and 72 are provided diagonally in staggered manner so that directions of their slopes are different.

[Ninth Embodiment]

As shown in FIG. 18(*a*), a slots group 81 was formed by providing slots 80 in a range from the end (lower end in FIG. 18(*a*)) of the terminal section 3 to a point before the sealing section 6, in the connecting electrodes 4. As shown in FIG. 18(*b*), a slots group 82 was formed by providing slots 80 in a range from the end of the terminal section 3 to the sealing section 6. As shown in FIG. 18(*c*), a slots group 83 was formed by providing slots 80 in a range from the end of the terminal section 3 to a point beyond the sealing section 6. The terminal section 3 having the slots groups 81, 82, and 83 respectively were bent so that the bending angle θ was 20°.

As a result, in the slots groups 82 and 83 shown in FIG. 18(*b*) and FIG. 18(*c*) respectively, the cracks 8 occurred partially, but this did not bring about the disconnection. However, in the slots group 83 shown in FIG. 18(*c*), it turned out that the nonuniformity of liquid crystal display occurred in the vicinity of the sealing section 6 on the side where liquid crystal is sealed, and it could not be used as a liquid crystal display element. Further, in the slots group 81 shown in FIG. 18(*a*), the cracks 8 occurred by the seal section 6 as shown in FIG. 19, and this brought about the disconnection.

Thus, as shown in FIG. 18(*b*), it is preferable that the slots group 82 is formed by providing the slots in a range from the end of the terminal section 3 to the sealing section 6.

[Tenth Embodiment]

Figure 20:
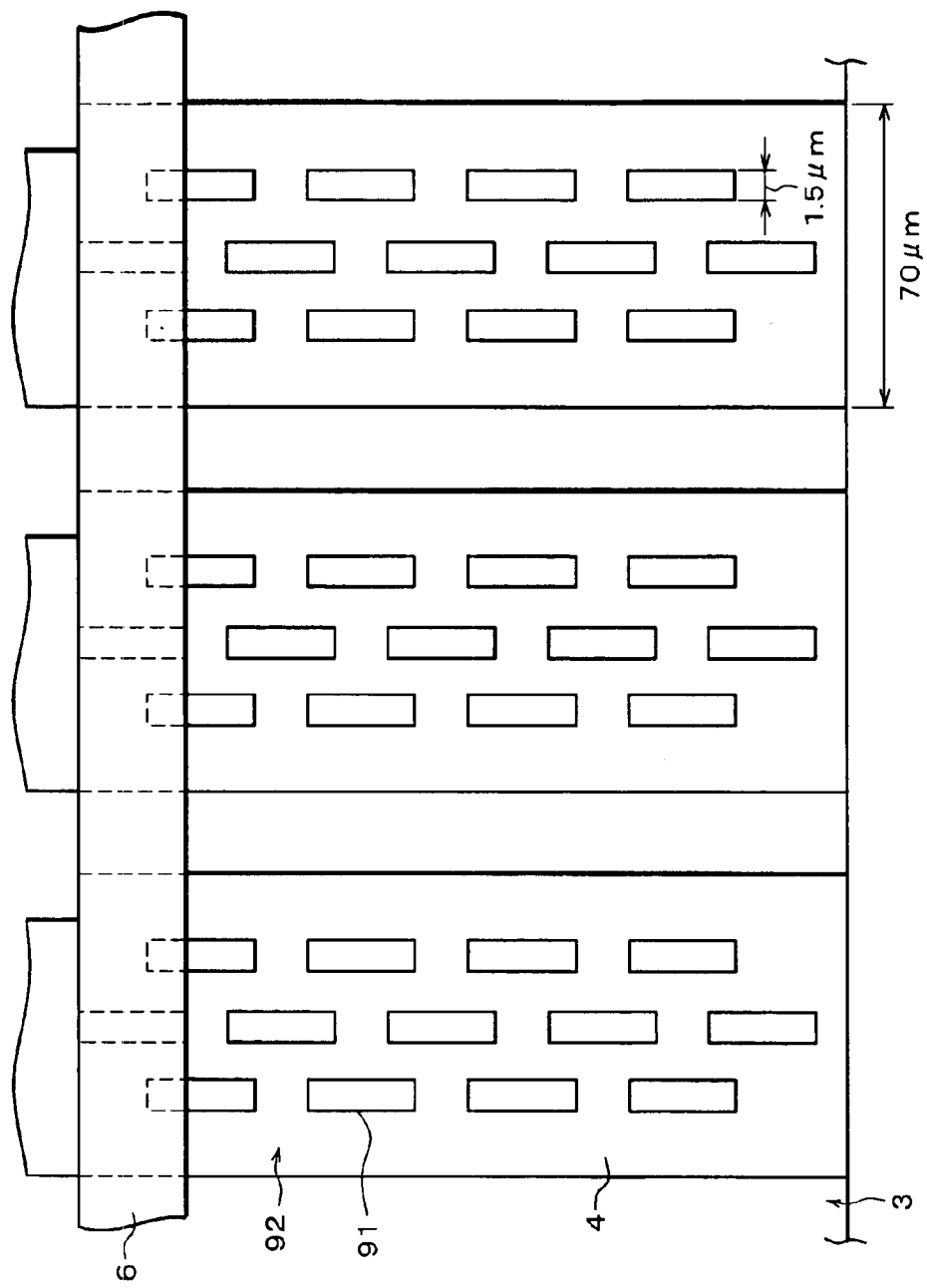
FIG. 20 is a plan view showing a state in which slots whose width is 1.5 μm are provided on the connecting electrode of the liquid crystal display element.
Figure 21:
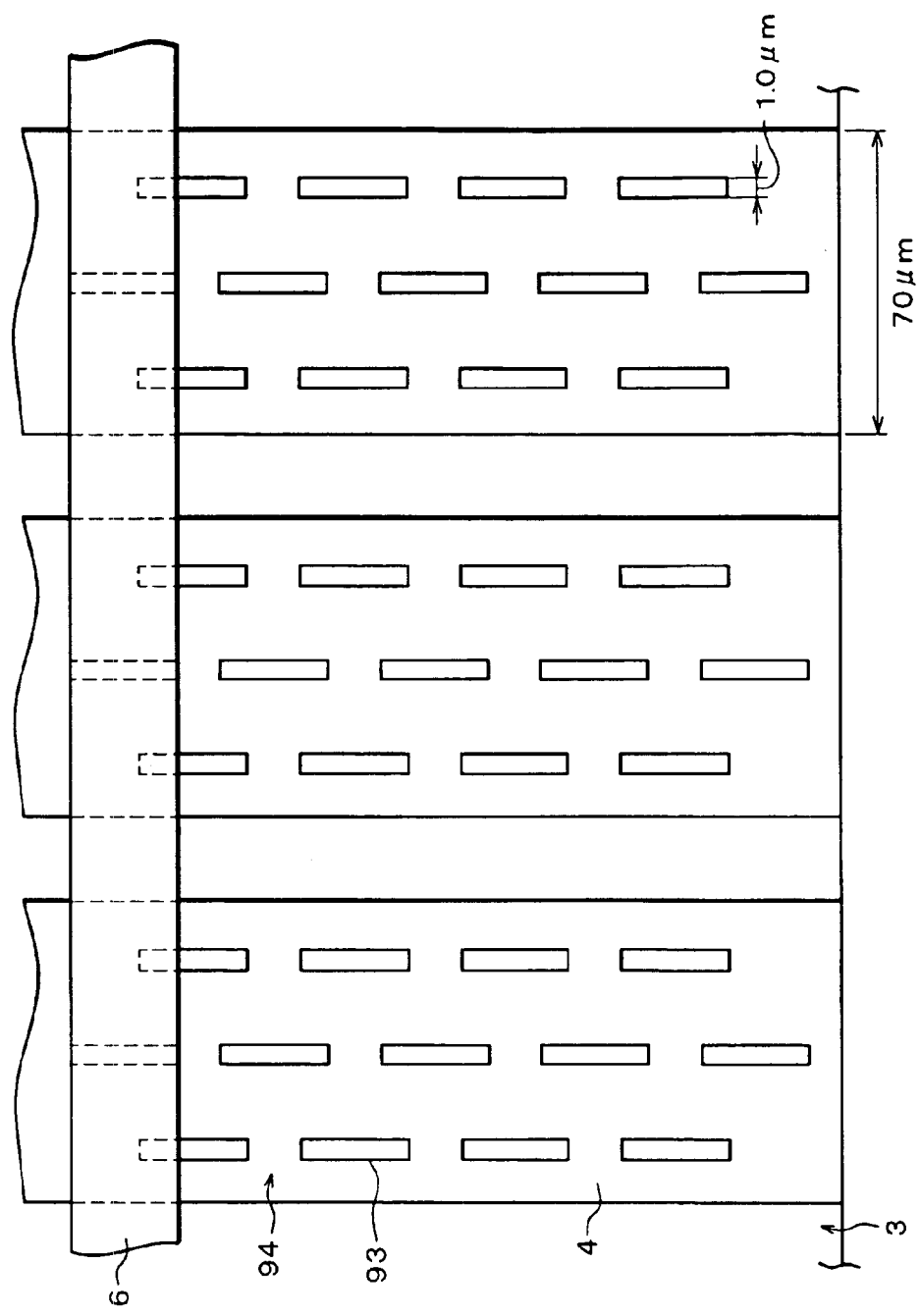
FIG. 21 is a plan view showing a state in which slots whose width is 1.0 μm are provided on the connecting electrode of the liquid crystal display element.
Figure 22:
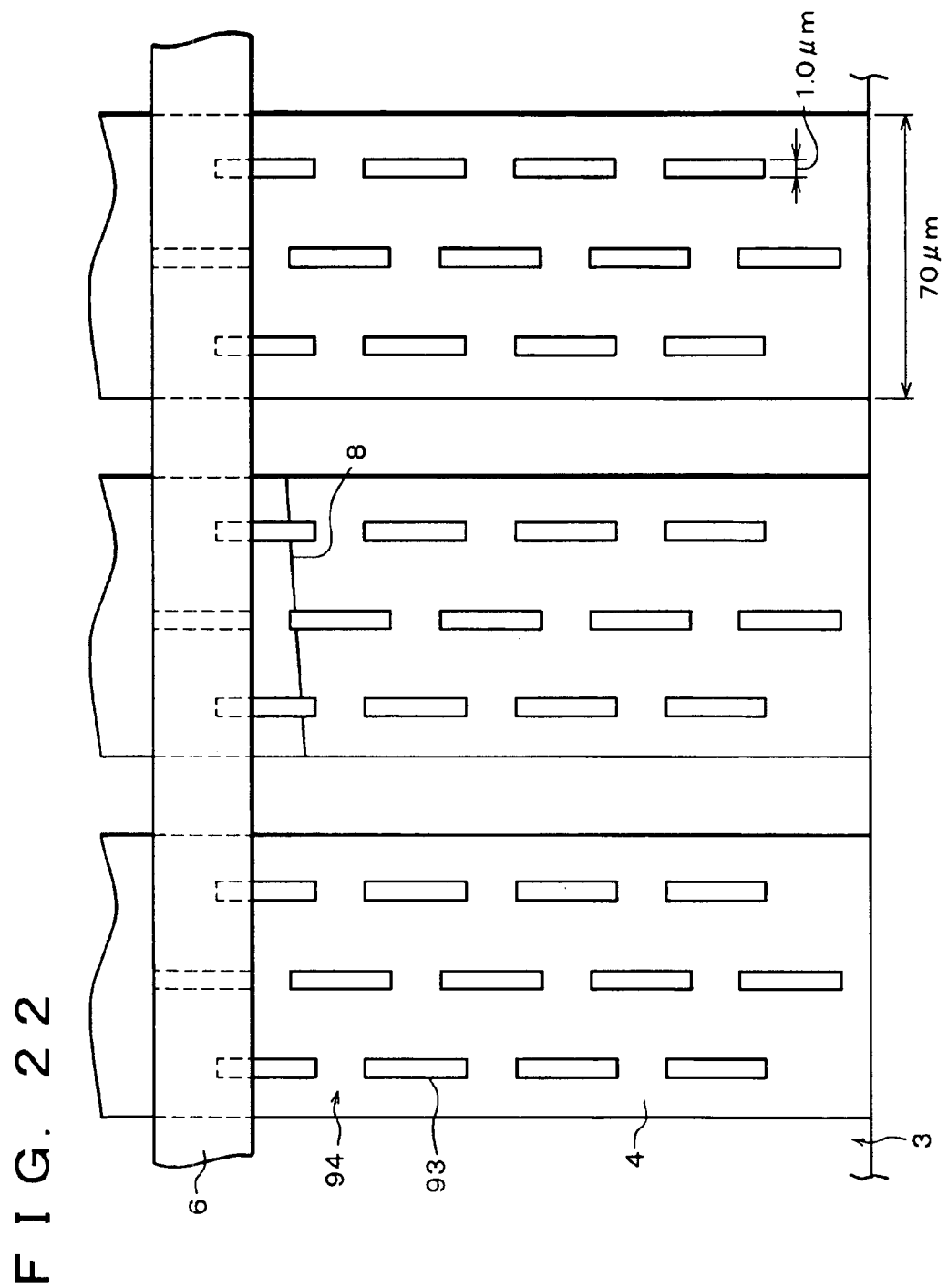
FIG. 22 is a plan view showing a state of a crack in a case where slots whose width is 1.0 μm are provided on the connecting electrode of the liquid crystal display element shown in FIG. 21.

As shown in FIG. 20, a slots group 92 was formed by providing slots 91 having 1.5 μm width in three lines on the connecting electrodes 4 having 70 μm. As shown in FIG. 21, a slots group 94 was formed by providing slots 93 having 1.0 μm width in three lines on the connecting electrodes 4 having 70 μm. The terminal section 3 having the slots groups 92 and 93 respectively were bent so that the bending angle θ was 20°.

As a result, the slots 93 of 1.0 μm width shown in FIG. 21 was too narrow to prevent the cracks 8 from penetrating, so that the disconnection occurred. On the other hand, the slots group 92 shown in FIG. 20 prevented the disconnection.

Thus, it is preferable that the width of the slots 93 provided on the connecting electrodes 4 in the width direction is not less than 1.5 μm.

[Eleventh Embodiment]

As shown in FIG. 23(a) and FIG. 23(b), the width of the connecting electrode 4 was expressed as L, and the total length in the width direction of slots 101 and 101 is expressed as s. Then, a liquid crystal display element in which the ratio of s/L is 2/10 and a liquid crystal display element in which the ratio of s/L is 1/10 were made.

As a result, in the liquid crystal display element in which the ratio of s/L is 2/10, a threshold value voltage rose largely, compared with a conventional liquid crystal display element. However, in the liquid crystal display element in which the ratio of s/L is 1/10, the threshold value voltage did not rise largely.

Thus, it is preferable that s/L, the ratio of the length of the slots 101 and 101 in the width direction of the connecting electrode 4 with respect to the length of the connecting electrode 4 in the width direction, is not more than 1/10.

[Twelfth Embodiment]

As shown in FIG. 24(a), on the connecting electrodes 4, a slots group 110 was formed by providing rectangular slots 111 in n line, and rectangular slots 112 in (n+1) line so that a slope of a tangent line of them is 20° with respect to the width direction of the connecting electrode 4. As shown in FIG. 24(b), a slots group 120 was formed by providing rectangular slots 121 in n line, and rectangular slots 122 in (n+1) line so that a slope of a tangent line of them is 30° in the width direction of the connecting electrode 4. The terminal section 3 having the slots group 110 and the slots group 120 respectively were bent. That is, d, the length of overlapped portion of the adjacent slots in the width direction of the connecting electrodes 4, was examined.

As a result, when the terminal section 3 was bent 25° in the layout of FIG. 24(a), the disconnection occurred, and when the terminal section 3 was bent 30° in the layout of FIG. 24(b), the disconnection occurred. Thus, in making a grating or a mesh, it is possible to obtain better effect against the bend by providing the slots so that the slope of the tangent line of n line and n+1 line is not less than 30° with respect to the width direction of the connecting electrode 4.

[Thirteenth Embodiment]

A grating of the first embodiment was processed with laser. A YAG laser microscope was used to irradiate the laser. Further, as long as the ITO can be processed, a laser light source is not restricted to the YAG laser. Instead of this, an excimer laser, and an argon ion laser etc. may be used. Further, an advantage in processing electrodes with the laser is that it is possible to process the electrodes after the electrodes are formed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display element provided by combining two substrates with each other, each substrate being made of a plastic plate, said liquid crystal display element comprising:
a liquid crystal display section having a plurality of pixels;
a terminal section which is provided by extending one of the substrates; and
a plurality of connecting electrodes, which are positioned from an inside of the liquid crystal display section to the terminal section so as to connect the plurality of pixels to a liquid crystal driving circuit, wherein
each of the connecting electrodes provided on the terminal section has a hole section that prevents penetration of a crack which occurs substantially parallel to a width direction of the connecting electrode.

2. The liquid crystal display element set forth in claim 1, wherein the hole section has a plurality of holes, and the respective holes are provided in the width direction and in a length direction orthogonal to the width direction of the connecting electrode.

3. The liquid crystal display element set forth in claim 2, wherein the holes adjacent in the width direction of the connecting electrode are provided on a straight line whose slope is not less than 30° and not more than 90° with respect to the width direction of the connecting electrode.

4. The liquid crystal display element set forth in claim 1, wherein the hole section is provided from an end of the connecting electrode to a sealing section of a liquid crystal display section.

5. The liquid crystal display element set forth in claim 1, wherein the hole section is made up of holes in a same shape.

6. The liquid crystal display element set forth in claim 1, wherein the hole section is made up of holes in different shapes.

7. The liquid crystal display element set forth in claim 1, wherein the hole section includes holes provided in a notched shape also on ends in the width direction of the connecting electrode.

8. The liquid crystal display element set forth in claim 1, wherein the hole is a slot, and the slot is provided so that a length direction of the slot is diagonal with respect to a length direction of the connecting electrode.

9. A liquid crystal display element provided by combining two substrates with each other, each substrate being made of a plastic plate, said liquid crystal display element comprising:
a liquid crystal display section having a plurality of pixels;
a terminal section which is provided by extending one of the substrates; and
a plurality of connecting electrodes, which are positioned from an inside of the liquid crystal display section to the terminal section so as to connect the plurality of pixels to a liquid crystal driving circuit, wherein
each of the connecting electrodes provided on the terminal section has a hole section in which at least one hole is provided on respective straight lines which are parallel to each other in a width direction of the connecting electrode.

10. The liquid crystal display element set forth in claim 9, wherein the hole section has a plurality of holes, and the respective holes are provided in the width direction and in a length direction orthogonal to the width direction of the connecting electrode.

11. The liquid crystal display element set forth in claim 10, wherein the holes adjacent in the width direction of the connecting electrode are provided on a straight line whose slope is not less than 30° and not more than 90° with respect to the width direction of the connecting electrode.

12. The liquid crystal display element set forth in claim 9, wherein the hole section is provided from an end of the connecting electrode to a sealing section of a liquid crystal display section.

13. The liquid crystal display element set forth in claim 9, wherein the hole section is made up of holes in a same shape.

14. The liquid crystal display element set forth in claim 9, wherein the holes are provided in a notched shape also on ends in the width direction of the connecting electrode.

15. The liquid crystal display element set forth in claim 9, wherein a ratio of a total width of said at least one hole which is provided on respective straight lines which are parallel to each other in a width direction of the connecting electrode, to a width of the connecting electrode is more than 0 and not more than 1/10.

16. A liquid crystal display element provided by combining two substrates with each other, each substrate being made of a plastic plate, said liquid crystal display element comprising:

a liquid crystal display section having a plurality of pixels;

a terminal section which is provided by extending one of the substrates; and a plurality of connecting electrodes, which are positioned from an inside of the liquid crystal display section to the terminal section so as to connect the plurality of pixels to a liquid crystal driving circuit, wherein each of the connecting electrodes provided on the terminal section has a plurality of holes, wherein the plurality of holes are provided in a width direction and in a length direction orthogonal to the width direction of the connecting electrode such that the holes adjacent in the width direction of the connecting electrode are provided on a straight line whose slope is not less than 30° and not more than 90° with respect to the width direction of the connecting electrode.

17. The liquid crystal display element set forth in claim 16, wherein the holes are provided from an end of the connecting electrode to a sealing section of a liquid crystal display section.

18. The liquid crystal display element set forth in claim 16, wherein the holes are provided in a same shape.

19. The liquid crystal display element set forth in claim 16, wherein the holes are provided in a notched shape also on ends in a width direction of the connecting electrode.

20. The liquid crystal display element set forth in claim 1, wherein the hole section includes a plurality of holes, and wherein at least two of the plurality of holes have a staggered arrangement.

21. The liquid crystal display element set forth in claim 9, wherein the hole section includes a plurality of holes, and wherein at least two of the plurality of holes have a staggered arrangement.

22. The liquid crystal display element set forth in claim 16, wherein at least two of the plurality of holes have a staggered arrangement.

23. The liquid crystal display element as set forth in claim 1, wherein the hole section includes a plurality of holes, and wherein at least two of the plurality of holes are arranged in a different arrangement, wherein the different arrangement is selected from the group consisting of (a) a different widthwise arrangement, (b) a different lengthwise arrangement, and (c) a different widthwise and different lengthwise arrangement.

24. The liquid crystal display element as set forth in claim 9, wherein the hole section includes a plurality of holes, and wherein at least two of the plurality of holes are arranged in a different arrangement, wherein the different arrangement is selected from the group consisting of (a) a different widthwise arrangement, (b) a different lengthwise arrangement, and (c) a different widthwise and different lengthwise arrangement.

25. The liquid crystal display element as set forth in claim 16, wherein at least two of the plurality of holes are arranged in a different arrangement, wherein the different arrangement is selected from the group consisting of (a) a different widthwise arrangement, (b) a different lengthwise arrangement, and (c) a different widthwise and different lengthwise arrangement.

26. The liquid crystal display element as set forth in claim 1, wherein the connecting electrode is a transparent electrode.

27. The liquid crystal display element as set forth in claim 9, wherein the connecting electrode is a transparent electrode.

28. The liquid crystal display element as set forth in claim 16, wherein the connecting electrode is a transparent electrode.

29. The liquid crystal display element as set forth in claim 1, wherein the hole section penetrates the connecting electrode.

30. The liquid crystal display element as set forth in claim 9, wherein the hole section penetrates the connecting electrode.

31. The liquid crystal display element as set forth in claim 16, wherein at least one of the plurality of holes penetrates the connecting electrode.

\* \* \* \* \*